US012805242B2

(12) United States Patent
Maddherla et al.

(10) Patent No.: US 12,805,242 B2
(45) Date of Patent: Nov. 17, 2026

(54) COOLING STATION

(71) Applicant: Applied Materials, Inc., Santa Clara, CA (US)

(72) Inventors: Pandu Maddherla, Bengaluru (IN); Sushant S. Koshti, Sunnyvale, CA (US); Devendra Channappa Holeyannavard, Bangalore (IN); Paul Benjamin Reuter, Austin, TX (US); Arunkumar Ramachandraiah, Bengaluru (IN); Sandesh Doddamane Ramappa, Bangalore (IN); Mallanagouda Patil, Bangalore (IN); James Christopher Hansen, Sunnyvale, CA (US); Raghu Ram Sunkavilli, Yellamilli (IN); Sivakumar Ramalingam, Bangalore (IN); Michael C. Kuchar, Georgetown, TX (US); Ramon Zaragoza, San Jose, CA (US); Sridhar Srinivasan Chari, Bangalore (IN)

(73) Assignee: Applied Materials, Inc., Santa Clara, CA (US)

( * ) Notice: Subject to any disclaimer, the term of this patent is extended or adjusted under 35 U.S.C. 154(b) by 38 days.

(21) Appl. No.: 18/525,471

(22) Filed: Nov. 30, 2023

(65) Prior Publication Data

US 2025/0183063 A1 Jun. 5, 2025

(51) Int. Cl.
*B33Y 80/00* (2015.01)
*B33Y 10/00* (2015.01)
*H10P 72/00* (2026.01)

(52) U.S. Cl.
CPC .......... *H10P 72/0434* (2026.01); *B33Y 10/00* (2014.12); *B33Y 80/00* (2014.12); *H10P 72/0466* (2026.01)

(58) Field of Classification Search
CPC ......... H01L 21/67109; H01L 21/67201; H01L 21/67; B33Y 10/00; B33Y 80/00; H10P 72/0466; H10P 72/0434
(Continued)

(56) References Cited

U.S. PATENT DOCUMENTS 5,239,200 A * 8/1993 Messina ................ H01L 23/473
361/689
8,698,048 B2 4/2014 Lerner
(Continued)

FOREIGN PATENT DOCUMENTS

EP 0790641 A1 8/1997
JP 4416323 B2 * 2/2010

OTHER PUBLICATIONS

International Search Report and Written Opinion for International Application No. PCT/US2024/052281, mailed Feb. 6, 2025, 9 Pages.

*Primary Examiner* — Len Tran
*Assistant Examiner* — An Bach Phan
(74) *Attorney, Agent, or Firm* — Lowenstein Sandler LLP

(57) ABSTRACT

A cooling station is provided including one or more cooling plates configured to support a substrate. Each cooling plate of the one or more cooling plates can include a monolithic body and one or more channels within the monolithic body that traverse an interior volume of the cooling plate. These channels can be configured to circulate a coolant within the cooling plate, wherein the coolant is to extract heat from the supported substrate that may be resting on top of the cooling plate. In some cases, a cross sectional shape of the one or more channels may be at least one of rectangular, circular, pentagonal, polygonal, hexagonal, or a gyroid.

20 Claims, 12 Drawing Sheets

(58) Field of Classification Search
USPC .......................................................... 165/287
See application file for complete search history.

(56) References Cited

U.S. PATENT DOCUMENTS

| | | | | |
|---|---|---|---|---|
| 8,971,009 | B2 | 3/2015 | Parkhe | |
| 9,721,871 | B2 | 8/2017 | Frey | |
| 10,008,404 | B2 | 6/2018 | Parkhe | |
| 10,249,526 | B2 | 4/2019 | Parkhe | |
| 10,512,125 | B2 | 12/2019 | Kitagawa | |
| 10,622,229 | B2 | 4/2020 | Parkhe | |
| 11,282,734 | B2 | 3/2022 | Kuno | |
| 2010/0040437 | A1 | 2/2010 | Iwabuchi | |
| 2012/0180979 | A1* | 7/2012 | Harrington | B23P 15/26 165/96 |
| 2018/0040537 | A1 | 2/2018 | Grassmann et al. | |
| 2019/0267218 | A1 | 8/2019 | Wang | |
| 2021/0092869 | A1 | 3/2021 | Lunsman et al. | |
| 2021/0257235 | A1* | 8/2021 | Kaneko | H10P 72/0602 |
| 2022/0010428 | A1* | 1/2022 | Kobayashi | C23C 16/4586 |
| 2022/0011835 | A1* | 1/2022 | Heydari | G05B 19/02 |
| 2023/0230852 | A1 | 7/2023 | Plotnikov et al. | |

* cited by examiner

COOLING STATION

TECHNICAL FIELD

Embodiments of the present disclosure relate generally to a substrate support device for supporting a substrate or a wafer, and in particular to a cooling station of an electronic device manufacturing system having one or more integrated sensors manufactured using a three-dimensional (3D) printing technique.

BACKGROUND

Traditionally, cooling stations for device manufacturing systems (e.g., for manufacturing semiconductor devices) are formed from machined aluminum plates, in which grooves are machined into a surface of the aluminum plates. Copper tubing is then swaged into the machined grooves, where the copper tubing will receive coolant for cooling of substrates supported by the machined aluminum plates. There is often poor thermal contact between the copper tubing and the aluminum plates into which it is swaged, which may cause non-uniform cooling of supported substrates. Additionally, the process of machining the grooves in the aluminum plates, inserting the copper piping into the grooves, and swaging the copper piping to the machined aluminum plates can be time consuming. Moreover, the machined aluminum plates are generally solid plates that lack integrated sensors.

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

According to one aspect of the present disclosure, a cooling station is provided. In some aspects, the cooling station includes one or more cooling plates configured to support a substrate. Each cooling plate of the one or more cooling plates includes a monolithic body, and one or more channels that are integral to the monolithic body and that traverse an interior volume of the cooling plate and are configured to circulate a coolant within the cooling plate. In aspects of the cooling station, the coolant is to extract heat from the supported substrate.

According to other aspects of the present disclosure, a system is provided. The system can include system a cooling station. The cooling station can include one or more cooling plates configured to support a substrate. In aspects of the system, each cooling plate of the one or more cooling plates can include one or more channels that traverse an interior volume of the cooling plate and are configured to circulate a coolant within the cooling plate to extract heat from the supported substrate, and one or more integrated sensors, configured to detect one or more conditions associated with the supported substrate. In aspects of the system, the cooling station can include a manifold coupled to the one or more cooling plates. In aspects of the system, the manifold is configured to deliver coolant to the one or more channels of the one or more cooling plates and to receive heated coolant from the one or more cooling plates.

According to another aspect of the present disclosure, a method is provided. The method can include, forming, through an additive manufacturing process, a first portion of a cooling plate of a cooling station. In aspects of the method, the first portion includes a cavity, one or more cooling channels and one or more additional channels. In aspects of the method, the one or more cooling channels traverse an interior volume of the cooling plate according to a channel path having a defined pattern. In aspects of the method, the method further includes disposing a sensor in the cavity, and forming at least one of an optical line or a conductive line in the one or more additional channels. In aspects of the method, at least one of the optical line or the conductive line connects to the sensor. In aspects of the method, the method further includes forming, through the additive manufacturing process, a second portion of the cooling plate on the first portion of the cooling plate. In aspects of the method, the second portion of the cooling plate at least partially covers the sensor.

BRIEF DESCRIPTION OF THE DRAWINGS

Aspects and implementations of the present disclosure will be understood more fully from the detailed description given below and from the accompanying drawings, which are intended to illustrate aspects and implementations by way of example and not limitation.

DETAILED DESCRIPTION

Figure 1B:
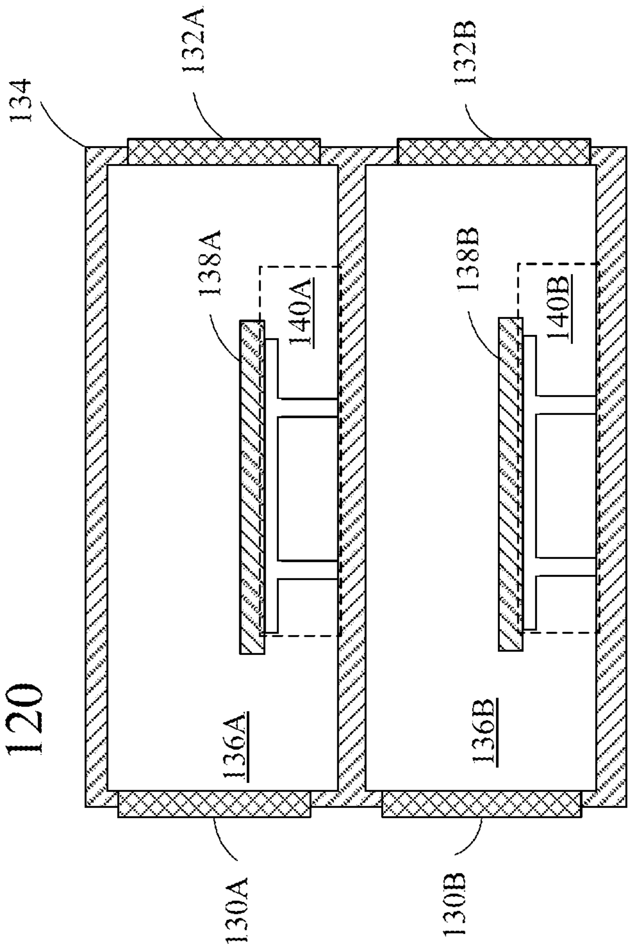
FIG. 1B illustrates a cut-away view of an exemplary load lock of the system of FIG. 1A, according to some embodiments of the present disclosure.

A persistent difficulty associated with load locks and cooling stations is the added time that it takes for the load lock and/or cooling station to safely achieve optimal transfer conditions (e.g., to cool a heated substrate to a temperature at which further storage, transfer and/or processing may be performed). Achieving optimal transfer conditions within a load lock chamber and/or on a cooling station may take a significant amount of time. For example, adjusting the temperature of a substrate to be close to a temperature at which it can be stored in a cassette (e.g., a front opening unified pod (FOUP) can take significant time. Such lengthy periods for temperature adjustment can have negative implications, including diminished overall throughput of the cluster tool, creation of bottlenecks at the load lock and/or cooling station, and decreased efficiency within a manufacturing process at large.

Such difficulties are clear with respect to temperature adjustments within the load lock and/or cooling station. Reaching a compatible temperature for both the chamber and the substrate is often time-consuming. This is compounded when the variations in temperatures between source and destination spaces are large. Furthermore, care should be taken to properly effect temperature changes, as improper adjustments, for example those that are too abrupt, or applied poorly, can damage substrates and/or system components.

Thus, the embodiments described herein address the above, and other challenges, by increasing the temperature adjusting capabilities of a load lock and/or a cooling station in a safe and effective manner. In some embodiments, a load lock and/or cooling station is provided with a substrate support device (e.g., a device to hold a substrate within the load lock chamber). The substrate support device can include one or more cooling plates (at times herein referred to as a "support structure"), to increase a capacity to directly extract heat from a substrate. One or more cooling channels in the cooling plates can direct flow of coolant through the cooling plate that the hot substrate is resting on, thus extracting heat from the substrate.

In some embodiments described herein the load lock system and substrate support structure can include integrated sensors to intelligently cool a supported substrate. For example, in some embodiments, one or more integrated temperature sensors in the cooling plates can detect the real-time temperature of the substrate. This information can be transmitted to a controller of the system which may increase, or decrease, or maintain the flow of coolant fluid (and level of heat extraction from the substrate) in response. Thus, coolant usage, power usage, and use of system resources in general can be optimized.

Accordingly, embodiments provide a smart cooling station and/or smart load lock that is able to detect current conditions and adjust a cooling based on those conditions. The smart cooling station and/or smart load lock may also determine when a temperature of the supported substrate has reached a target temperature, and may trigger a robot arm to remove the substrate from the cooling station and/or load lock once it has reached the target temperature. Traditionally, no active temperature measurements of a substrate are performed, and instead the substrate is placed on the cooling station for a predefined time period, after which it is assumed that the substrate has reached the target temperature. However, this may lead to the cooling being performed for too long a period (e.g., because the substrate reached the target temperature well before it was removed from the cooling station or load lock) or the cooling being performed for too short a period (e.g., because the substrate was hotter than expected when it was initially placed on the cooling station or load lock). These issues are eliminated in embodiments by providing a smart cooling system or load lock that can measure a temperature of the substrate and determine when it has reached a target temperature.

Additionally, in embodiments the smart cooling station and/or load lock may detect the presence of a substrate, and activate cooling when a substrate is detected. This may reduce power consumption and/or resource consumption associated with cooling by turning off cooling when substrates are not on the cooling station or in the load lock. In some embodiments, the load lock and/or cooling station may include one or more temperature sensors that measure a temperature of a coolant. A controller may adjust a flow rate of the coolant and/or a temperature of the coolant based on the detected temperature of the coolant and the detected temperature of the substrate (e.g., based on a delta between the substrate temperature and the coolant temperature) in embodiments.

In some embodiments described herein the load lock system and/or cooling station (e.g., substrate support structure) can include one or more integrated proximity sensors to detect the presence of a supported substrate. In response to the absence, or detection, of the substrate, the controller can further adjust coolant flow rates, as discussed above. Thus, through use of a second type of integrated sensor, the system can further optimize use of system resources.

In some embodiments, the load lock substrate support device can be manufactured using a method of additive manufacturing (e.g., three-dimensional (3D) printing). This enables coolant flow paths, electrical conduits, and sensors to be integral to the support structure, regardless of the complexity of the support structure or channel design. For example, integral cooling channels can be formed within the body of the cooling plates of the load lock and/or cooling station rather than machining grooves and swaging copper tubing into the grooves. The cooling channels and the cooling plate may be part of a same monolithic plate body that has been 3D printed to include the cooling channels. The 3D printed cooling plates may also be 3D printed to include cavities for electrical components, sensors, electrical lines, optical lines, etc., which may have been formed during the 3D printing process. Accordingly, the cooling plates may each be a single monolithic body that has integrated electrical components, sensors, electrical lines, optical lines, etc. in addition to, or instead of, integrated cooling channels. The body, or portions thereof, for the cooling plate may also include other features such as an internal lattice structure that provides strength and rigidity while reducing weight and material usage.

Use of additive manufacturing (e.g., 3D printing) for forming the cooling plates and/or other plates of the load lock and/or cooling station enables devices and structures to be embedded within the channels and/or cavities formed within an interior of the plates. For example, electrical communications conduits (e.g. conductive wire(s)) and sensors can be directly embedded into a channel and/or cavity formed within a substrate support device. Integrated electronics can provide inherent protection for delicate components, and promote system resilience. In other examples, specific channel features, such as surface roughness, bend radii, and dimensions of turbulence-inducing obstructions can be precisely formed in the body of the cooling plates and/or other plates.

Further added benefits of using additive manufacturing to manufacture plates for load locks (e.g., for substrate supports of load locks) and/or cooling stations can include smaller part count, uniform density, uniform material composition, decreased weight, higher rigidity, tighter design tolerances, resilience against vibrations, and/or the ability to embed electrical components into complex device geometries. Reference will now be made to the figures of the application, describing embodiments of the present disclosure.

Figure 1A:
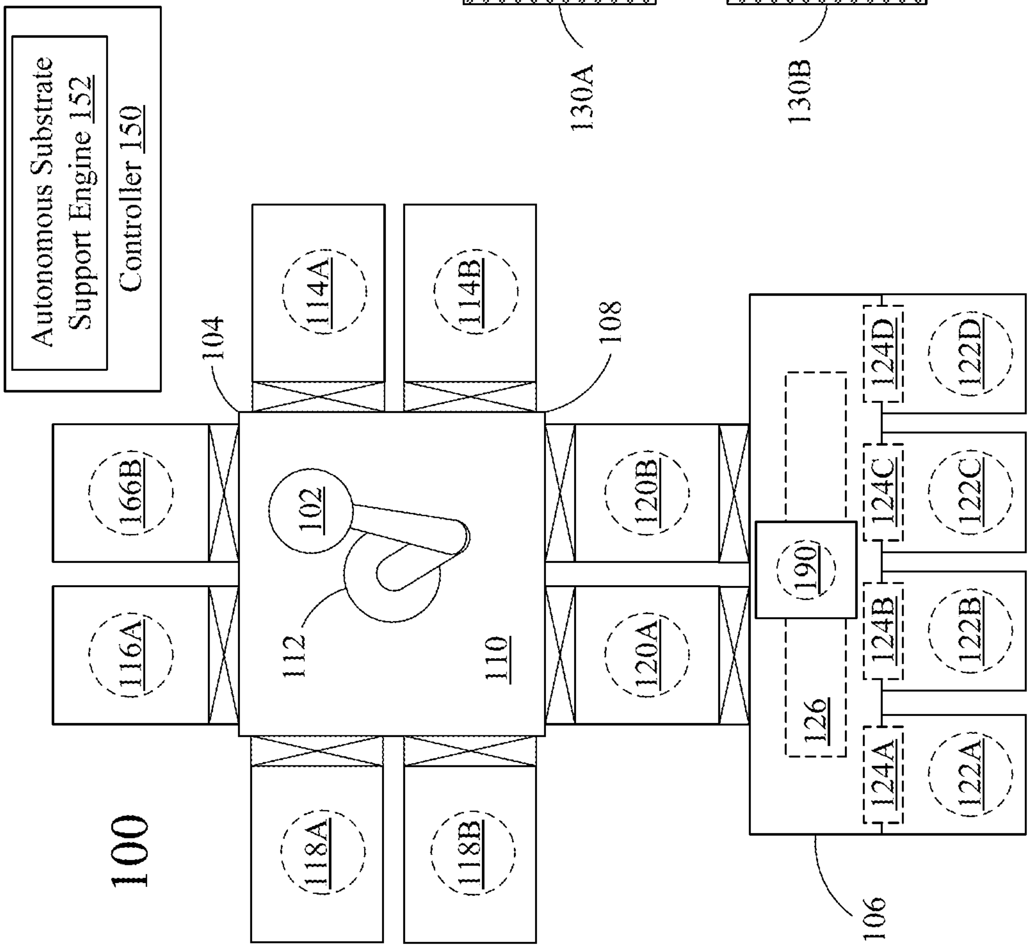
FIG. 1A illustrates a top-down view of an exemplary embodiment of a substrate manufacturing system, according to some embodiments of the present disclosure.

FIG. 1A illustrates a top-down view of an exemplary embodiment of a substrate manufacturing system, according to some embodiments of the present disclosure.

As seen, FIG. 1A illustrates a substrate manufacturing system 100 (also referred to as a "system," "substrate processing system," or "electronic device manufacturing system") that is configured for substrate fabrication (e.g., for fabrication of semiconductor devices, displays, photovoltaic devices, etc.) in accordance with at least some embodiments of the disclosure. In an exemplary embodiment, manufacturing system 100 may comprise a processing portion 104, a transfer chamber 110, load locks 120A-B, a factory interface 106, and substrate carriers 122A-D (at times referred to herein as "front opening unified pods (FOUPs)"). Processing portion 104 may include a plurality of process chambers 114A-B, 116A-B, and 118A-B, wherein specific and controlled substrate manufacturing processes occur. Transfer chamber 110 may house a transfer robot 112 including a substrate transfer mechanism such as an end effector 102 ("substrate transfer mechanism" and "end effector" will be used interchangeable moving forward in the disclosure) that may transport substrates. Transfer chamber 110 may be in transfer chamber housing 108. Load locks 120A-B may interface with both the processing portion 104 and the factory interface 106. Factory interface 106 may include a factory interface robot 126, for transferring substrates to and from the carriers 122A-D and the load locks 120A-B. Factory interface may further include a plurality of load ports 124A-D for receiving carriers 122A-D carrying one or more substrates. Transfer chamber 110 is generally maintained at vacuum pressure levels, while factory interface 106 is generally maintained at atmospheric pressure.

In some embodiments, transfer chamber 110 and process chambers 114A-B, 116 A-B, and 118A-B, may be maintained at a vacuum level. Load locks 120A-B may alternate pressures between a vacuum level (e.g., when opened to transfer chamber 110) and atmospheric pressure (e.g., when opened to factory interface 106). The vacuum level for the transfer chamber 110 may range from about, e.g., 0.01 Torr (10 mTorr) to about 80 Torr. Other vacuum levels may be used.

The factory interface robot 126 is configured to transfer the substrate from the FOUPs 122A-D to load locks 120A-B through load lock doors. In some embodiments, the factory interface robot 126 may serve a specialized function of transferring substrates from Front Opening Unified Pods (FOUPs) 122 to a designated load lock of load locks 120A-B. The robot may be designed with precision and reliability in mind, ensuring that a transferred substrate's orientation and integrity are maintained throughout the process. The movement sequence may involve extracting a substrate from its FOUP 122A-D and securely placing it into one of the load locks through the corresponding load lock doors.

The number of load locks can be more or less than two but for illustration purposes only, two load locks 120A-B are shown with each load lock having a door (e.g., a slit valve) to connect it to the factory interface 106 and a door to connect it to the transfer chamber 110. Load locks 120A-B may or may not be batch load locks.

In some embodiments, the load locks may be equipped with several sensors and/or integrated control systems for adding intelligent capabilities to the overall system. For example, such sensors can monitor various chamber parameters, such as temperature, pressure, cleanliness, etc., within the load lock chamber. Sensor data may then be relayed in real-time to a control system, which can responsively adjust conditions within the load lock to optimize substrate handling and processing. For instance, in some embodiments, a sensor of a load lock may detect a deviation in the vacuum level. In response, the control system might automatically activate pumps to restore pressure conditions. In a similar manner and example, temperature sensors may initiate cooling and/or heating elements to maintain the substrates at, or cause the substrates to reach, a predefined temperature range.

Thus, the load locks 120A-B, under the control of a controller 150, can be maintained at and/or transitioned between an atmospheric pressure environment or a vacuum pressure environment, and serve as an intermediary or temporary holding space for a substrate that is being transferred to/from the transfer chamber 110.

The transfer chamber includes robot 112 that is configured to transfer the substrate from the load locks 120 to one or more of the plurality of processing chambers 114A-B, 116A-B, 118A-B (also referred to as process chambers), or to one or more pass-through chambers (also referred to as vias), without vacuum break, i.e., while maintaining a vacuum pressure environment within the transfer chamber 110 and the plurality of processing chambers 114A-B, 116A-B, 118A-B.

In some embodiments, the load locks 120A-B may be used to hold hot substrates that are at an elevated temperature due to recent processes performed on the substrates (e.g., at any of processing chambers 114A-B, 116A-B, 118A-B). In some embodiments, the load lock includes a substrate support device such as a cooling station. The substrate support device (e.g., cooling station) in the load lock may include a temperature sensor to measure a temperature of the substrate(s) disposed therein. As will be described below, in some embodiments, one or more substrate support device(s) of the load locks may actively cool the substrates (e.g., may be cooling stations). Load lock cooling may include supporting a substrate within the load lock until the substrate cools down to a target temperature, after which the factory interface robot may retrieve the substrate from a load lock.

Additionally, the load locks 120A-B may be used to hold substrates while they are heated to pre-processing temperatures that are close to temperatures that the substrates will be heated to during processing by one or more processing chambers 114A-B, 116A-B, 118A-B. The load locks 120A-B may include one or more heaters disposed therein for heating of the substrates. In some embodiments, the substrate support device in the load lock includes a temperature sensor to measure the temperature of the substrate. The substrate may be held until the substrate is heated to a target temperature, after which the transfer chamber robot may retrieve the substrate from the load locks 120A-B.

The plurality of processing chambers 114A-B, 116A-B, 118A-B are configured to perform one or more processes. Examples of processes that may be performed by one or more of the processing chambers 114A-B, 116A-B, 118A-B include cleaning processes (e.g., a pre-clean process that removes a surface oxide from a substrate), anneal processes, deposition processes (e.g., for deposition of a cap layer, a hard mask layer, a barrier layer, a bit line metal layer, a barrier metal layer, etc.), etch processes, and so on. Examples of deposition processes that may be performed by one or more of the process chambers include physical vapor deposition (PVD), chemical vapor deposition (CVD), atomic layer deposition (ALD), and so on. Examples of etch processes that may be performed by one or more of the process chambers include plasma etch processes.

In some embodiments, transfer chamber 110 and/or factory interface 106 may include one or more cooling stations and/or other substrate supports disposed therein. Substrates may be placed at the cooling stations to cool down after processing. The cooling stations may include integrated sensors such as pressure sensors, temperature sensors, proximity sensors, presence sensors, etc. to detect temperatures of supported substrates. The proximity measurements and/or pressure measurements and/or presence measurements may be used to determine when to activate and/or deactivate cooling. The temperature sensors may be used to adjust cooling (e.g., to speed up or slow down cooling) and/or to determine when a substrate has reached a target temperature and can be removed from the cooling station.

Controller 150 (e.g., a tool and equipment controller, a tool cluster controller, etc.) may control various aspects of the cluster tool 100, e.g., gas pressure in the processing chambers, individual gas flows, spatial flow ratios, plasma power in various process chambers, temperature of various chamber components, radio frequency (RF) or electrical state of the processing chambers, and so on. The controller 150 may receive signals from and send commands to any of the components of the cluster tool 100, such as the robot 112 and 126, process chambers 114A-B, 116A-B, 118A-B, load locks 120A-B, substrate supports (e.g., cooling stations) of load locks, cooling stations in the FI and/or transfer chamber, slit valve doors, and/or one or more sensors (e.g., integrated in one or more substrate supports such as cooling plates of load locks and/or cooling stations), and/or other processing components of the cluster tool 100. The controller 150 may thus control the initiation and cessation of processing, may adjust a deposition rate and/or target layer thickness, may adjust process temperatures, may adjust a type or mix of deposition composition, may adjust an etch rate, may initiate processes on the load locks 120A-B (e.g., such as cooling, heating, etc.), may determine when to remove substrates from cooling stations, may adjust coolant flow rate, may adjust coolant temperature, and the like. The controller 150 may further receive and process sensor measurement data (e.g., optical measurement data, vibration data, spectrographic data, particle detection data, temperature data, etc.) from various sensors (e.g., sensors integrated into substrate support devices (e.g., cooling plates) of load locks 120 and/or cooling stations) and make decisions based on such measurement data.

In various embodiments, the controller 150 may be and/or include a computing device such as a personal computer, a server computer, a programmable logic controller (PLC), a microcontroller, and so on. The controller 150 may include (or be) one or more processing devices, which may be general-purpose processing devices such as a microprocessor, central processing unit, or the like. More particularly, the processing device may be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device may also be one or more special-purpose processing devices such as an application specific integrated circuit (ASIC), a field programmable gate array (FPGA), a digital signal processor (DSP), network processor, or the like. The controller 150 may include a data storage device (e.g., one or more disk drives and/or solid-state drives), a main memory, a static memory, a network interface, and/or other components. The processing device of the controller 150 may execute instructions to perform any one or more of the methodologies and/or embodiments described herein. The instructions may be stored on a computer readable storage medium, which may include the main memory, static memory, secondary storage and/or processing device (during execution of the instructions). In some embodiments, controller 150 is a dedicated controller for load lock(s) 120A-B.

In embodiments, the processing device and memory of controller 150 have an increased capacity as compared to processing power and memory size of traditional controllers for cluster tools. In embodiments, the processing device and memory are sufficient to handle parallel execution and use of multiple trained machine learning models, as well as training of the machine learning models. For example, the memory and processing device may be sufficient to handle parallel execution of 6-15 different machine learning models (e.g., one or more for each of the process chambers 114A-B, 116A-B, 118A-B, and/or load locks 120A-B).

In embodiments, a substrate processing flow includes using robot 126 to transfer a substrate into a load lock 120A, 120B, using robot 112 to retrieve the substrate from the load lock 120A, 120B and to place the substrate into a processing chamber 114A, 114B, 116A, 116B, 118A, 118B, and processing the substrate at the processing chamber 114A, 114B, 116A, 116B, 118A, 118B. The substrate processing flow may additionally include transferring the substrate between two or more of the processing chambers 114A, 114B, 116A, 116B, 118A, 118B, and processing the substrate in multiple of the processing chambers 114A, 114B, 116A, 116B, 118A, 118B. One or more of the processes may cause the substrate to become heated. After the processes to be performed in the processing chambers 114A, 114B, 116A, 116B, 118A, 118B are complete, the substrate processing flow may include retrieving a heated substrate from a processing chamber 114A, 114B, 116A, 116B, 118A, 118B and placing the heated substrate in a load lock 120A, 120B. The robot 126 may retrieve the heated substrate from the load lock 120A, 120B and place the heated substrate at a cooling station 190. In embodiments, the cooling station 190 includes multiple lift pins (e.g., 3 lift pins) onto which the substrate is placed at the cooling station 190. The lift pins may lower to cause the substrate to rest on a set of ceramic contacts of the cooling station. The ceramic contacts may be, for example, ceramic balls in a cooling plate of the cooling station 190.

The substrate may be cooled at the cooling station 190 until the substrate reaches a target temperature, after which the substrate may be retrieved from the cooling station 190 by robot 126 and placed into a carrier 122A-D. Alternatively, cooling station 190 may be omitted, and a cooling station within a load lock 120A, 120B may be used to cool the substrate. The cooling station in the load lock 120A, 120B and/or cooling station 190 in the factory interface 106 may be a 3D printed cooling station as described in embodiments herein. In some embodiments, robot 112 and/or robot 126 includes one or more first end effectors composed of metal, which may be used to handle substrates that are not heated (e.g., that are below a threshold temperature). In some embodiments, robot 112 and/or robot 126 includes one or more second end effectors composed of quartz, which may be used to handle heated substrates (e.g., substrates that are above a threshold temperature).

In one embodiment, the controller 150 includes an autonomous substrate support engine 152, which may be an autonomous load lock engine and/or an autonomous cooling station engine in embodiments. The autonomous substrate support engine 152 may be implemented in hardware, firmware, software, or a combination thereof. The autonomous substrate support engine 152 may be configured to receive and process measurement data generated by one or more sensors of substrate supports of load locks 120 (e.g., of integrated sensors in substrate support devices of load locks 120) and/or cooling plates during and/or after cycling of substrates through the load locks and/or cooling stations. The sensor measurements may include temperature measurements, pressure measurements, particle measurements, spectrographic measurements, vibration measurements, accelerometer measurements, voltage measurements, current measurements, resistance measurements, time measurements, optical measurements (e.g., such as optical emission spectrometry measurements and/or reflectometry measurements), position measurements, humidity measurement, part health measurements, and/or other types of measurements. Some example measurements include a chamber pressure (e.g., which may be measured in mTorr), OES spectra measurements for one or more wavelengths or frequencies (e.g., for wavelengths of 3870 nm, 7035 nm, 775 nm, and so on), one or more substrate support/heater temperatures, one or more substrate temperatures, substrate presence, and so on. In some embodiments, some or all of these measurements may be combined to generate a feature vector that is input into a trained machine learning model of the autonomous substrate support engine 152. In some embodiments, some or all of these measurements may be input into a rules-based engine that may determine one or more actions to perform based on the measurement(s) satisfying one or more criteria or rules.

In some embodiments, some types of measurements may be generated by sensors integrated with the substrate supports (e.g., cooling plates) of load locks and/or cooling stations. In other embodiments, as discussed below, sensors may be placed or integrated with plates including cooling plates and/or other substrate support devices of the load locks and/or cooling stations.

Further embodiments, of the system will now be provided. The autonomous substrate support engine 152 running on controller 150 may include one or more rules-based engines and/or trained machine learning models for controlling and/or making decisions for one or more load locks and/or cooling stations. The one or more trained machine learning models may have been trained to receive sensor measurements from and/or associated with a load lock and/or cooling station and to make a prediction, classification or determination about the load lock and/or cooling station. Each of the trained machine learning models may be associated with a different decision-making process for a load lock and/or cooling station in embodiments. Alternatively, one or a few trained machine learning models may be associated with multiple decision-making processes for a load lock in embodiments.

In one embodiment, one or more of the trained machine learning models is a regression model trained using regression. Examples of regression models are regression models trained using linear regression or Gaussian regression. A regression model predicts a value of Y given known values of X variables. The regression model may be trained using regression analysis, which may include interpolation and/or extrapolation. In one embodiment, parameters of the regression model are estimated using least squares. Alternatively, Bayesian linear regression, percentage regression, leas absolute deviations, nonparametric regression, scenario optimization and/or distance metric learning may be performed to train the regression model.

In one embodiment, one or more of the trained machine learning models are decision trees, random forests, support vector machines, or other types of machine learning models.

In one embodiment, one or more of the trained machine learning models is an artificial neural network (also referred to simply as a neural network). The artificial neural network may be, for example, a convolutional neural network (CNN) or a deep neural network. In one embodiment, processing logic performs supervised machine learning to train the neural network.

Artificial neural networks generally include a feature representation component with a classifier or regression layers that map features to a target output space. A convolutional neural network (CNN), for example, hosts multiple layers of convolutional filters. Pooling is performed, and non-linearities may be addressed, at lower layers, on top of which a multi-layer perceptron is commonly appended, mapping top layer features extracted by the convolutional layers to decisions (e.g. classification outputs). The neural network may be a deep network with multiple hidden layers or a shallow network with zero or a few (e.g., 1-2) hidden layers. Deep learning is a class of machine learning algorithms that use a cascade of multiple layers of nonlinear processing units for feature extraction and transformation. Each successive layer uses the output from the previous layer as input. Neural networks may learn in a supervised (e.g., classification) and/or unsupervised (e.g., pattern analysis) manner. Some neural networks (e.g., such as deep neural networks) include a hierarchy of layers, where the different layers learn different levels of representations that correspond to different levels of abstraction. In deep learning, each level learns to transform its input data into a slightly more abstract and composite representation.

One of more of the trained machine learning models may be recurrent neural networks (RNNs). An RNN is a type of neural network that includes a memory to enable the neural network to capture temporal dependencies. An RNN is able to learn input-output mappings that depend on both a current input and past inputs. The RNN will address past and future measurements and make predictions based on this continuous measurement information. For example, sensor measurements may continually be taken during a process, and those sets of measurements may be input into the RNN sequentially. Current sensor measurements and prior sensor measurements may affect a current output of the trained machine learning model. One type of RNN that may be used is a long short term memory (LSTM) neural network.

Some trained machine learning models of an autonomous substrate support engine 152 use all sensor measurements generated by a load lock, cooling station and/or associated devices. Some trained machine learning models of an autonomous substrate support engine 152 use a subset of generated sensor measurements.

Controller 150 may be operatively connected to a server (not shown). The server may be or include a computing device that operates as a factory floor server that interfaces with some or all tools in a fabrication facility. The server may perform training to generate the trained machine learning models, and may send the trained machine learning models to autonomous substrate support engine 152 on controller 150. Alternatively, the machine learning models may be trained on controller 150.

Training of a neural network may be achieved in a supervised learning manner, which involves feeding a training dataset consisting of labeled inputs through the network, observing its outputs, defining an error (by measuring the difference between the outputs and the label values), and using techniques such as deep gradient descent and backpropagation to tune the weights of the network across all its layers and nodes such that the error is minimized. In many applications, repeating this process across the many labeled inputs in the training dataset yields a network that can produce correct output when presented with inputs that are different than the ones present in the training dataset. In high-dimensional settings, such as large images, this generalization is achieved when a sufficiently large and diverse training dataset is made available.

FIG. 1B illustrates a cut-away view of an exemplary load lock of the system of FIG. 1A, according to some embodiments of the present disclosure.

Load lock 120 of FIG. 1B includes an upper and lower chamber 136A and 136B in embodiments. Load lock 120 may correspond, or be similar, to load lock chambers 120A and/or 120B, as seen and described in FIG. 1A, and incorporate and augment at least the embodiments described therein.

In some embodiments, load lock 120 may include upper and lower chambers 136A and 136B that are separated by a housing 134. Housing 134 may separate the two chambers, and isolate each from the exterior environment. In some embodiments, housing 134 may be any suitable material to support the pressure and temperature changes associated with the load lock. E.g., in some embodiments, housing 134 may be a single-piece machined aluminum block.

Each load lock chamber may include a respective set of doors. Upper chamber 136A may include upper chamber doors 130A and 132A, and lower chamber 136B may include lower chamber doors 130B and 132B. In some embodiments, chamber doors 130A-B and 132A-B can open to permit a robot arm to place or remove a substrate from the interior of a respective chamber. Accordingly, chamber doors 130A-B and 132A-B may be ports and mechanisms to accommodate a robot arm end effector and a substrate. For example, in some embodiments, chamber doors 130A-B and 132A-B may be slit valves doors that create an opening large enough for an end effector and substrate. In some embodiments, an end effector may pick or place a substrate to or from the load lock, and then chamber doors 130A-B and 132A-B can close to seal off an interior of the load lock chamber.

Accordingly, in some embodiments, a substrate (e.g., one of substrates 138A-B) may be transferred into the load lock 120 from a factory interface (as was described with respect to FIG. 1A) through doors 130A-B. A process may occur (e.g., adjusting a temperature and/or pressure of the load lock). Then the substrate may be transferred out through doors 132A-B. Similarly, in reverse, a substrate may be transferred into the load lock through doors 132A-B. One or more processes may occur, and then the substrate may be transferred out through doors 130A-B to a factory interface.

In some embodiments, substrates 138A-B may be made out of one or more materials including Silicon, Germanium, Gallium Arsenide (GaAs), silicon dioxide ($SiO_2$ or silica), Indium Phosphide (InP), Silicon Germanium (SiGe), Silicon Carbide (SiC), Gallium Nitride (GaN), glass, or any one or more materials commonly used within electronic device manufacturing systems. In some embodiments, substrates 138A-B may be formed from one material. In other embodiments, substrates 138A-B may be formed from a homogenous mixture of materials. In other embodiments, substrates 138A-B may be made out of one or more stacked layers of one or more differing materials. By way of example, substrates 138A-B may be silicon on insulator (SOI) wafers, where a layer of $SiO_2$ is placed vertically between two insulative silicon layers.

In some embodiments, each chamber of the load lock 120 may function independently. In other embodiments, they may function in unison. In some embodiments, load lock 120 may be a batch load lock that has substrate supports for supporting multiple substrates. In one embodiment, load lock 120 may include a single chamber.

In some embodiments, each lock chamber may accommodate one or more substrates (e.g., substrates 138A-B) that are supported by substrate support devices 140A-B, which may be cooling stations and/or cooling plates. The substrate support device of a load lock chamber typically refers to the structure or device that holds the substrate in place. Each substrate support device may be designed to securely hold the substrate while ensuring that it can be moved into and out of the load lock chamber with case and without damage. In some embodiments, substrate support devices may be flat platforms or trays on which the substrate rests. These may be static or include mechanisms for rotation or other movement, such as vertical movement. In some embodiments, substrate support devices may also include clamping or other securement mechanisms to keep the substrate in place, particularly during any movements. In some embodiments, more than one substrate may be supported by each substrate support devices 140A and 140B.

As will be further discussed in FIGS. 2A-5D, in some embodiments, the substrate support device (e.g., cooling plates) of a load lock and/or cooling station may include thermal control capabilities. For instance, the substrate support can be heated or cooled to heat or cool supported substrates and/or maintain the substrates at a particular temperature. A substrate support device (e.g., one or more plates of the substrate support device) may include embedded heating and/or cooling elements that apply cooling and/or heating in one or more zones, may include different types of heating and/or cooling methods, and so on. For example, in some embodiments a substrate support device may include cooling channels through which a coolant is flowed to provide liquid cooling of supported substrates. In some embodiments, associated sensors and/or control mechanism and components may be integrated into a substrate support device.

In some embodiments, substrate support devices 140A-B may be configured to move within their respective load lock chamber or cooling station. For example, in some embodiments, substrate support device 140A-B may each be attached to an indexer, configured to raise or lower the support device with respect to the support device's chamber. In some embodiments, the support device(s) may be laterally displaced, so as to securely receive a substrate. For example, in some embodiments, the lateral position of a substrate support device may be calibrated to properly interact with an end effector of the system. Thus, in some embodiments, the position of the substrate support device may be adjusted in any dimension with respect to the load lock chamber or cooling station. Furthermore, in some embodiments, substrate support device 140A-B may be configured to rotate within the chamber or cooling station.

In embodiments, substrate support device 140A, 140B includes one or more plates (e.g., cooling plates) that have been manufactured via an additive manufacturing process. The one or more plates may each have a monolithic body with integral cooling channels formed therein. The one or more plates may also include one or more embedded sensors, electrical components, electrical lines, optical lines, a lattice structure, and so on formed therein during the additive manufacturing process. The substrate support device 140A, 140B may have a shape and/or features that are not achievable using a traditional technique of machining an aluminum plate to form a substrate support structure.

Figure 2A:
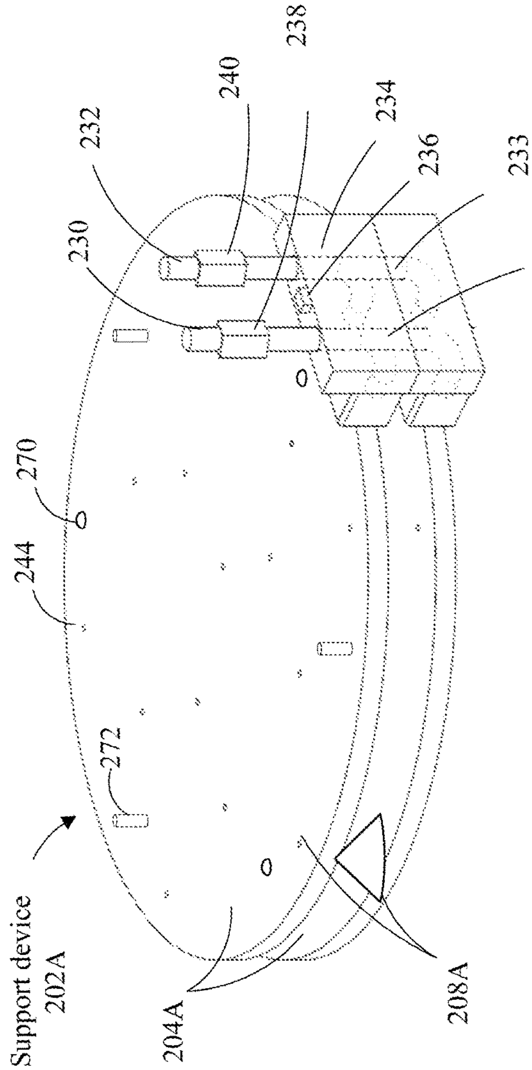
FIG. 2A illustrates an exemplary substrate support device of the load lock or cooling station of FIG. 1A, according to certain embodiments.

FIG. 2A illustrates an exemplary substrate support device of the load lock or cooling station of FIG. 1A, according to certain embodiments.

As seen, FIG. 2A illustrates a substrate support device 202A, which may include a first and second support structure (e.g., support structures 204A), each of which may be a cooling plate. In some embodiments, substrate support device 202A may correspond, or be similar, to substrate support device(s) 140A and/or 140B, as seen and described in FIG. 1B, and incorporate and augment at least the embodiments described therein.

As discussed previously, in some embodiments a substrate support device 202A (e.g., a cooling plate) may support one or more substrates via support structures 204A. For example, in some embodiments, a substrate may rest on the top surface (e.g., support structure tops 208A) of support structure 204A, or 205A. In some embodiments, substrate support device 202A may include more than two support structures (e.g., more than two cooling plates). In some embodiments, any number of substrates may be supported, as is feasible within a load lock and/or cooling station associated with the substrate support device.

In some embodiments, the support structures of a substrate support device may not be vertically stacked as seen in FIG. 2A. One of ordinary skill in the art, having the benefit of this disclosure, will appreciate that numerous layouts and configurations for such a substrate support device exist, and that substrate support device 202A as seen in FIG. 2A is an exemplary representation of a substrate support device of a load lock.

In some versions, substrate support device 202A may include support structures with perforations 244 in the support structure top 208A. These perforations may have different types, diameters, and support a number of purposes.

In an example, a portion or all of perforations 244 may be for allowing internal sensors a line of sight to a substrate supported by the substrate support structure. Such sensors may be temperature sensors, proximity sensors, and/or any other type of sensor that relies on a line of sight. In other embodiments, these sensors may be any of the previously recited sensors, which may rely on physical contact with a substrate, and such sensors may project through a perforation to physically contact the substrate. These sensors, and others, will be further discussed with respect to FIG. 5.

In some embodiments, the perforations may serve other functions.

In some embodiments, a substrate supported by support structures 204A may directly rest on the surface of a support structure. In some embodiments, support structures 140A may include a set of support points 270 on which substrates may rest (as will be further seen and discussed with respect to FIG. 3A-B). Support points 270 may be physical protrusions or features (e.g., ceramic balls) that may protrude above the cooling plate (e.g., above support structure 204A) to directly contact, and support, a substrate. In some embodiments, the support points may be retractable. In some embodiments, the support points 270 may be formed from materials or equipment with the thermal tolerance capabilities suitable to contact what may be a substrate with a high internal temperature. For example, in some cases, support points 270, may be, or include, ceramic spheres that are inset into the top surface of the support structure top 208A.

Thus, in some embodiments, a substrate may not rest directly on the top surface of a support structure. Instead, a substrate may rest a distance above a support structure 204A, which the support points protrude to. In some embodiments, the support points rise, and a substrate may be supported at a level of, about 0.02 inches above the top surface of a substrate support upper surface. In other embodiments, a substrate may be supported, for example, about 0.03 inches above the top surface of a substrate support top. In other embodiments, a substrate may be supported anywhere between about 0.01 and 0.05 inches above the top surface of a substrate support upper surface. In some embodiments, the support points 270 protrude about 30-50 mil above the cooling plate. Accordingly, a backside of a supported substrate may be about 30-40 mil from a top surface of a cooling plate (e.g., of support structure 204A). In some embodiments, support points 270 include circular pattern ceramic balls that are counter bored into each plate (e.g., into each support structure 204A) to provide a 30-40 mil gap between the bottom of the wafer and the top of the plate.

In some embodiments, support structure 204A includes a set of lift pins 272 (e.g., 3 lift pins). The lift pins may be raised and/or lowered to retrieve a substrate from a robot end effector, to place a substrate on a robot end effector, to place the substrate on the contact points 270, and/or to lift the substrate off of contact points 270. In some embodiments, each lift pin 272 includes one or more contact points (e.g., ceramic contact points) at a tip of the lift pin 272 for contacting the substrate. In some embodiments, ceramic balls are mounted over or on lift pins 272.

In some embodiments, each substrate support device may be connected to one or more fluid conduits, (e.g., fluid conduits 230 and/or 232) via a manifold 234. In embodiments, the manifold 234 is a single component that combines both an inlet and an outlet for fluid to flow from or to cooling plates (e.g., from/to each substrate support). In some embodiments, the manifold and/or cooling plates include quick disconnect couplers (e.g., blind-mate quick disconnect couplers). In embodiments, O-rings are used at connections between the manifold and cooling plates. In embodiments, the cooling plates are mounted to the manifold using bolts or other attachment devices. The manifold 234 may fluidly couple to integrated cooling channels within the support structures (e.g., cooling plates) 204A, for supplying and/or removing coolant from a flow structure (e.g., the cooling channels) in the support structures (as will be further described in FIG. 2B). In some embodiments, fluid conduit 230 may provide coolant to support structures of substrate support device 202A. In some embodiments, fluid conduit 232 may remove coolant from support structures of substrate support device 202A.

As seen, in some embodiments, manifold 234 may be fluidly connected to one or more support structures. Thus, manifold 234 may include an internal input flow path 231 fluidly connecting input flow conduit 230 to entry passages of each associated support structure of the substrate support device. Manifold 234 may similarly include an internal output flow path 233 that may collect coolant from the exit passages of the one or more connected support structures. The manifold 234 may collect coolant from each connected support structure and then exhaust the coolant from the system via the output fluid conduit 232. In some embodiments, manifold 234 includes one or more components manufactured via an additive manufacturing process. In some embodiments, manifold 234 is a monolithic structure formed via an additive manufacturing process. The monolithic structure may have internal channels formed during the additive manufacturing process in embodiments, similar to the support structures 204A.

In some embodiments, manifold 234 includes one or more cavity for receiving and/or mounting a pressure switch. The manifold may include a passage that enables connection of inlet and outlet flows for detection of a pressure differential in embodiments. In embodiments, manifold includes a leak detector disposed therein or thereon. For example, the leak detector may include a leakage pan, a light emitter, and a light receiver. The light emitter may direct a beam of light towards the leakage pan. If no water is in the leakage pan, then the light may be reflected back to the receiver. However, if there is water in the leakage pan, then the light may be scattered, and it may not be reflected back to the receiver.

In some embodiments, manifold 234 includes an embedded temperature sensor and/or an access point for a probe of an attached temperature sensor. The temperature sensor may be used to detect a temperature of coolant to/from the cooling plates and/or a temperature of the manifold in embodiments.

In some cases, as seen in FIG. 2A, two support structures may be connected to manifold 234, and manifold may include internal flow paths as seen in FIG. 2. In other cases, manifold 234 may be connect to one, three, or any number of support structures as is feasible given the coolant viscosity, pressures, and flow capacities of the system. Thus, in some cases, the manifold may include internal flow passages (e.g., integral channels) to one, two, or any number of support structures, as seen in FIG. 2A, mutatis mutandis.

In some embodiments, a number of sensors can be associated with the manifold 234 and fluid conduits 230 and 232. For example, a moisture sensor 236 may be placed on a surface of the manifold. The surface may be internal or external. The moisture sensor may detect moisture and/or leakage from any of the connections and proximal portions of fluid conduits fluidly coupled with the manifold. In some embodiments, the moisture detector can be connected to a controller of the system (e.g., the controller 150 as seen and described in FIG. 1). In some cases, the moisture sensor can be used to detect a leak in the system.

In some embodiments, fluid conduit 230 can include an input conduit sensor 238. In some cases, sensor 238 can be a flow sensor for measuring the rate at which coolant ingresses into the manifold through fluid conduit 230. In some embodiments, fluid conduit 232 can include an output conduit sensor 240. In some cases, sensor 240 can include both a temperature and a pressure sensor for measuring the temperature and pressure of coolant as it egresses from the manifold through fluid conduit 232.

In some cases, sensor 238 and/or sensor 240 can include more than one sensor. In some cases sensor 238 and/or sensor 240 can include any combination of a flow sensor, a temperature sensor, and/or a pressure sensor. Both sensors can be connected to a controller of the system (e.g., the controller 150 as seen and described in FIG. 1).

In some cases, sensor 238 and/or sensor 240 can include a flow sensor that may be a turbine flow sensor, an impeller or similar type of flow sensor, a vortex flow sensor, an ultrasonic flow sensor, a thermal type of flow sensor, or any other type of flow sensor that may be used within electronic device manufacturing systems.

In some cases, either or both sensors 238 and 240 can include a thermal sensor that may be a thermocouple, resistive temperature detectors (RTDs), infrared sensor, optical sensor, spectroscopic sensor, acoustic temperature sensor, thermal imaging camera, thin-film temperature sensor, thermistor, fiber optic temperature sensor, solid-state sensor, capacitive temperature sensor, and/or any other kind of temperature sensor that may be used within electronic device manufacturing systems.

In some cases, either or both sensors 238 and 240 can include a pressure sensor that may be a piezoelectric pressure sensor, a piezoresistive pressure sensor, a strain gauge pressure sensor, a capacitive pressure sensor, an optical pressure sensor, a bourdon tube, a diaphragm pressure sensor, a thermal conductivity pressure sensor, and/or any other kind of pressure sensor that may be used within electronic device manufacturing systems.

In embodiments, support device 202A is an active cooling station (e.g., an active wafer cool down station) that provides water cooling while maintaining high system throughput.

The support structure 204A (e.g., cooling plate or cool down plate) of support device 202A may provide a uniform temperature surface where a substate rests during a vent cycle to reduce the substrate to below 100° C. in embodiments. In embodiments, support device 202A is configurable for one, two or three cooling plates (e.g., support structures 204A).

In some embodiments, support structures 204A include locating pins (e.g., quartz locating pins) that allow the capture of substrates within 20-30 mils of standoff. In some embodiments, ceramic balls are mounted over or on the locating pins. These locating pins may be mounted over a plate that can move up/down with a 10-30 mm (e.g., 15 mm) stroke during wafer IN/OUT movements.

Figure 2C:
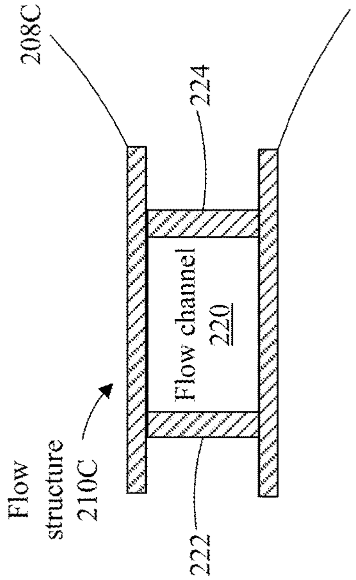
FIG. 2C illustrates a cross-sectional view of an exemplary flow structure of the support structure of FIG. 2B, according to some embodiments of the present disclosure.
Figure 2B:
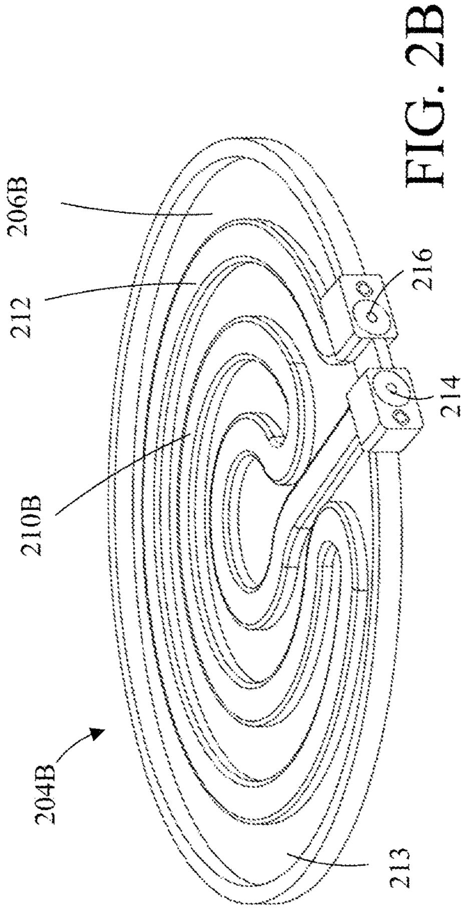
FIG. 2B illustrates a cutaway view of an exemplary support structure of the substrate support device of FIG. 2A, according to some embodiments of the present disclosure.

FIG. 2B illustrates a cutaway view of an exemplary support structure (e.g., cooling plate) of the substrate support device of FIG. 2A, according to some embodiments of the present disclosure.

As seen, FIG. 2B may include support structure 204B, which may correspond to a support structure of a substrate support device. In some embodiments, support structure 204B may correspond, or be similar, to either of support structures 204A, as seen and described in FIG. 2A, and incorporate and augment at least the embodiments described therein.

In some embodiments, support structure 204B may correspond to a sectional view of a support structure with the support structure top surface removed. I.e., in some embodiments, the objects and components of support structure 204B seen in FIG. 2B may rest beneath a top surface of the support structure. The top surface may not actually be removable in embodiments (e.g., may be part of a monolithic body that includes the bottom surface, interior, channels and top surface. Accordingly, the top surface may be shown as removed for illustrative purposes in embodiments.

As seen in FIG. 2B, support structure 204B can include a support structure base 206B (e.g., cooling plate bottom surface), a flow structure 210B (e.g., a cooling channel) that follows a particular flow structure path 212, and a flow structure entry passage 214 and a flow structure exit passage 216. In some embodiments, the support structure may include a space 213 seen between portions of the flow structure 210B.

Space 213, in some embodiments, may include all the spaces surrounding flow structure 210B within the interior volume of the support structure. In some embodiments, space 213 may be filled in. Thus, in some embodiments, the space 213 may not be empty (as seen in FIG. 2B), and may be filled in with same, or different material as the support structure base. Thus, support structure may be filled in so as to be solid, outside of the flow structure 210B.

In other embodiments, the space 213 may not be solidly filled in, and may be empty (as seen and described in FIG. 2B). In such embodiments, the space 213 may filled with a gas, or liquid, with a high thermal conductivity, to promote heat transfer. In other embodiments, the space 213 may be empty, or vacuous.

In other embodiments, the space 213 may hold structural elements for support structure. For example, in some embodiments, the space 213 may include a lattice structure, ribs, and/or pillars, connecting the support structure base and the support structure top. In embodiments, the interior features of support structure 204B are all part of a single monolithic body that has been 3D printed to have those features.

A lattice structure such as a honeycomb structure may be used for ribs, or pillars, of structural elements within space 213, in some embodiments. In some embodiments, volume infilling of the space 213 is performed using a lattice structure such as a honeycomb structure, a porous structure, a cell structure, etc. This may enable the cooling plate to have a reduced thickness (e.g., below 13 mm) while achieving a maximum heat transfer rate and a minimum weight. In some embodiments, a bottom side and/or top side of the cooling plate includes a lattice structure (e.g., of netted ribs) that may enable a forced convection to an environment. The surface lattice or rib structure in the top and/or bottom surface may increase a heat transfer rate of the cooling plate. For example, at least one of a top of the one or more cooling plates or a bottom of the one or more cooling plates may comprise a plurality of rib structures that are configured to increase convection-based heat transfer of heat from a supported substrate.

Figure 4A:
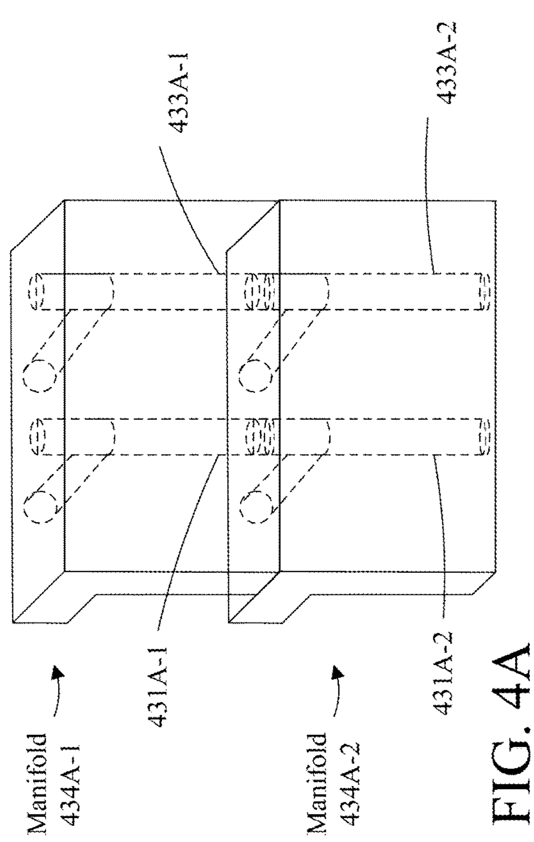
FIG. 4A illustrates a perspective view of exemplary manifold of the support structure of FIG. 2B, according to some embodiments of the present disclosure.
Figure 4B:
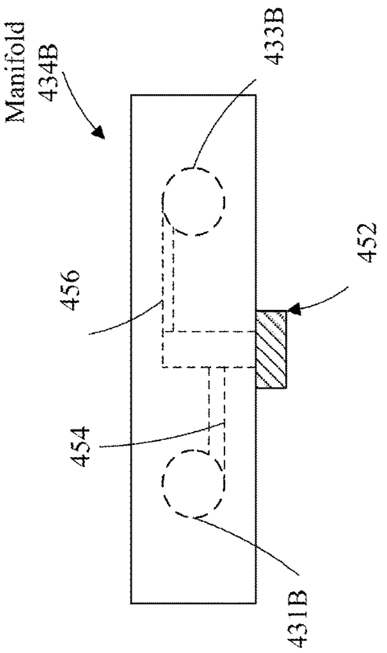
FIG. 4B illustrates a top-down view of exemplary manifold of the support structure of FIG. 2B, according to some embodiments of the present disclosure.

As will be further seen in FIG. 4B, in some embodiments, space 213 may include structural elements that are ribs in the form of a honeycomb or lattice, surrounding the flow structure 218. In some embodiments honeycombed ribs of space 213 may serve to maintain a structure integrity of the support structure. In some embodiments, such a lattice or honeycomb, or similar, structure may be included in any portion of the support structure, e.g., the support structure base, the space 213, or the support structure top.

In embodiments, the thicknesses and parameters of solid-filled, or lattice structures (e.g., infilled portions) of the support structure may be optimized for heat transfer. For example in some embodiments, base 206B may be a honeycomb, or ribbed structure with an optimized thickness for heat transfer. In embodiments, base 206B may be anywhere from 12 mm to 13 mm, or from 10 mm to 15 mm thick. In embodiments, the support structure top (as described with respect to FIGS. 2A and 2C may also be similarly optimized. Thus, the support structure top may include a honeycomb, or ribbed structure with an optimized thickness for heat transfer. In embodiments, the top may be anywhere from 12 mm to 13 mm, or from 10 mm to 15 mm thick.

In some embodiments, flow structure 210B may be used to circulate coolant within an internal body of support structure 204B, according to some embodiments of the present disclosure. In some embodiments, this coolant may be used to remove heat from a substrate (not shown) that is supported by the support structure.

For example, in some embodiments, coolant may enter the flow structure 210B through flow structure entry passage 214, circulate through the flow structure and associated flow structure path, and exit via flow structure exit passage 216. In some embodiments, the coolant may collect, or remove, heat from the supported substrate through conduction through a top surface (e.g., top 208A as seen in FIG. 2A, not shown in FIG. 2B).

Through such an internal mechanism, a support structure may cool, or extract heat from, a supported substrate. In some embodiments, flow structure 210B may traverse an inner volume of support structure 204B according to a flow structure path 212. As seen in FIG. 2B, flow structure path 212 may be circular and contain curves and curvatures as the flow structure path traverses the inner volume. In some embodiments, the flow structure path 212 may be as seen in FIG. 2B. In other embodiments, the flow structure path may be a different path, such as a spiral, a zig zag, line, etc.

In some embodiments, flow structure path 212 may include curvature of a certain curve radius (as will be further described in FIG. 4). The curve radius may be a curve radius that is not achievable with traditional piping (e.g., copper piping) used in cooling plates. In some embodiments, a flow structure path may include a certain amount of spacing between itself (as will be further described with respect to FIG. 4). In some embodiments, a flow structure path may be circular, or include circular contours. In other embodiments, the flow structure path may be square and/or include straight contours and 90-degree angles. One of ordinary skill in the art, having the benefit of this disclosure, will appreciate that numerous layouts, curvatures, and contours for a flow structure path exist, and that flow structure path 212 as seen is an exemplary representation of a flow structure path associated with a flow structure.

FIG. 2C illustrates a cross-sectional view of an exemplary flow structure of the support structure of FIG. 2B, according to some embodiments of the present disclosure.

As seen in FIG. 2C, flow structure 210C may be a flow structure of a support structure (e.g., of a cooling plate). In some embodiments, flow structure 210C may correspond, or be similar, to flow structure 210B, as seen and described in FIG. 2B, and incorporate and augment at least the embodiments described therein. In some embodiments, components associated with flow structure 210C, such as support structure base 206C and/or support structure top 208C, may correspond to support structure base 206B and/or support structure top 208A as seen and described in FIGS. 2A-B.

In some embodiments, flow structure 210C may include flow structure sidewalls 222 and 224. Together with support structure base 206C and support structure top 208C, sidewalls 222 and 224 may define a flow channel 220. Flow channel 220 may hold a coolant as was previously described in FIG. 2B. A rectangular cross-sectional shape is shown for flow structure 210C. However, it should be understood that the flow structure 210C may have other cross-sectional shapes, such as a diamond shape, a circular shape, a square shape, a star shape, a half-circle shape, and/or any other arbitrary shape.

The following disclosure discusses the types of coolant, material compositions, and method of manufacture with respect to the substrate support device and components (e.g., support structures, flow structures, flow structure paths, etc.), according to some embodiments. The following disclosure should be viewed as incorporating and augmenting the disclosure with respect to FIGS. 2A-C, and substrate support devices described within the system (including within all figures or disclosures) generally.

The coolant types employed by the system may vary, according to some embodiments of the present disclosure. In some embodiments, flow channel 220 in conjunction with flow structure 210C may be designed to accommodate a broad spectrum of coolants that are commonly utilized in the realm of electronics device manufacturing systems. Such coolants can include, but are not limited to, water-based coolants (e.g., PCW coolant, etc.), organic coolant compounds (e.g., ethylene glycol), and/or specialty coolants (e.g., fluorocarbon-based solutions). In some embodiments, the choice of coolant may be influenced by a variety of considerations including the geometry of a specific flow structure path. The specific curves or angles or flow rates of a flow structure path may impose restrictions on the type of coolant through demands on viscosity characteristics, coolant density, etc. for optimal flow. Additionally, in some embodiments, the heat transfer objectives of the cooling system may direct selection of a coolant to one with superior thermal conductivity properties to achieve efficient heat dissipation from the associated substrates. Other relevant factors may be considered, including but not limited to compatibility with the materials comprising the flow structure and channel. The potential for corrosive interactions between coolant and a material used to form the flow structure 210C (e.g., cooling channels) may also be considered. In some embodiments, an interior of the flow structure 210C is coated by a film or layer or coating to provide corrosion resistance.

The material composition of system components may vary, according to some embodiments of the present disclosure. As discussed above, a variety of materials can be utilized for a substrate support device, for a cooling plate, for a manifold, for a coolant flow structure, and so on. Such materials can be selected to facilitate effective heat removal from the substrate, while maintaining structural integrity. In some embodiments, metallic options may be used. Metallic options may include but are not limited to, aluminum, copper, stainless steel, and so on. Aluminum may be advantageous due to favorable thermal conductivity, cost-effectiveness, and material density. Copper may be selected to provide increased thermal conductivity. Stainless steel may be selected to provide resistance to corrosion and compatibility with environmental conditions and/or chemically aggressive coolants.

In some embodiments, the materials utilized may be plastic and/or polymer-based materials, such as polyvinyl chloride (PVC), polyethylene, or polypropylene, etc. Such materials may be implemented in scenarios where lower temperature applications are involved and chemical resistance is a priority. Weight considerations may also be a factor when contemplating plastics and polymer-based materials versus metals or alloys.

In some embodiments, ceramic materials like silicon carbide or alumina may be employed. Composite materials, such as carbon fiber composites or metal matrix composites such as aluminum-silicon carbide, may be employed. Alloys (e.g., nickel-based or titanium alloys) may also be used within the system. Alloys may be employed due to their thermal tolerance and corrosion resistance. In some embodiments, transparent materials, e.g., glass, quartz materials, etc., can be used to include optical transparency in the system.

In some embodiments, more than one material or a homogenous combination of the above materials might be utilized by the substrate support device and associated or incorporated components.

In some embodiments, one or more coatings may be applied to the material of the flow structure, to protect against elements within the coolant. For example, in some embodiments, the coolant may be, or include, process cooling water (PCW), and the flow structure and flow channel may be of a material prone to corrosion (e.g., aluminum). In such an embodiment, a trivalent chromium process (TCP) may be applied to form a TCP layer and provide corrosion resistance to the aluminum of the flow structure and flow channel.

In some embodiments, any coating process commonly used within a substrate manufacturing system may be employed, including, but not limited to, hexavalent chromium coating (HCC), anodizing, zinc or nickel plating, galvanizing, or other such or similar processes. In embodiments, the coating process is performed after the support structure (e.g., cooling plate) has been formed (e.g., has been 3Dprinted).

The methods of manufacture for system components may vary, according to some embodiments of the present disclosure. In some embodiments, substrate support devices, support structures, and components as illustrated in FIG. 1B and FIGS. 2B-C, including the embodiments discusses therein, may be crafted via a conventional method of manufacturing.

In other embodiments, a method of additive manufacturing can be used to form any of the above bodies and/or components in a single, monolithic workpiece. For example, in some embodiments, multiple support structures, including two or more support structures, may be used to form a substrate support device (e.g., substrate support device 202A of FIG. 2A) that may be a monolithic body. In some embodiments, a cooling station includes multiple plates connected together via a manifold. Each of the plates and the manifold may constitute a separate monolithic body. In some embodiments, each of the plates and a portion of the manifold constitute a monolithic body.

In some embodiments, the formation of monolithic structures can be facilitated through additive manufacturing methods, including but not limited, to 3D printing technologies. In some embodiments, additive manufacturing may be used such that the entire substrate support device (including any interior channels or conduits thereof) may be one monolithic part. In some embodiments, each plate of the substrate support device may be a monolithic part, which may be connected to a manifold.

Employing a method of additive manufacturing may result in a number of beneficial features for the substrate support device including, but not limited to, increased rigidity of the substrate support device, higher precision and accuracy for target dimensions and tolerances of the substrate support device, uniform material consistency and density throughout the substrate support device, decreased part count (i.e. essentially just one part or a few parts) for the substrate support device, decreased weight of the substrate support device (e.g., due in part to the absence of fasteners and connectors), and increased possibility for complexity of the design of the substrate support device.

In some embodiments, characteristics such as enhance rigidity, uniform density, etc. may further contribute to dampening or limiting the transmission of mechanical vibrations, potentially extending operational lifespan and improving capability for stable coupling to other system components. In some embodiments, the monolithic and uniform nature of the substrate support device when formed by additive manufacturing can result in reduced cost due to the minimal assembly required for the part, reduced or altogether removed fasteners, and reduced material waste, since the design geometries can be formed without excess unusable material.

In some embodiments, the design of a flow path, integrated sensor placement, electrical or fluid conduit placement, support structure, and/or substrate support device may not be possible to manufacture foregoing the use of additive manufacturing methods. As discussed above, in some embodiments, this method of manufacturing can serve to allow for unique cavities or conduits located within the body of the substrate support device (e.g., unique shapes and/or configurations for cooling channels in cooling plates). In some embodiments, formed conduits within the device (e.g., flow structures and flow structure paths) can extend throughout the entirety of a support structure of a substrate support device. This can be in whatever fashion and in whatever diameter and/or dimensions as designed to extract heat from a supported substrate.

In some embodiments, additionally conduits can enable integration for electrical components such a communication conduit(s), wire(s), sensor(s), and other electronics devices associated with the electronic device manufacturing system. In such cases, one or more sensors may be integrated into a plate and/or manifold. For example, all sensors may be integrated, and no electrical components or wires may be exposed exterior of the substrate support device, or to the interior of the load lock chamber, FI, or transfer chamber.

In some cases, an electrical conduit can be directly printed during an additive manufacturing process. In other cases, a channel for an electric conduit can be printed during an additive manufacturing process, and an electric conduit later installed. For example, in some embodiments, the substrate support device can first be formed, and afterwards the electrical components, communications conduit(s) (e.g., a fiber optic cable), conductive wire(s) and sensor(s), etc. can be inserted into their corresponding locations. In other embodiments, the electrical components, communications conduit(s), wire(s), and/or sensor(s) may be placed at their respective locations with respect to the substrate support device as the device is being formed using additive manufacturing. A combination of such procedures may be used.

For example, in some cases, a channel of the support structure can be printed, or a portion thereof can be printed. Then an electrically insulating layer, such as a polymer or a dielectric, can be printed into the channel or portion of the channel. Afterwards, an electrically conductive material such as tin, lead, aluminum, etc., can be printed, or inserted, on top of the insulating layer. After, another insulative layer can be printed, such that the electrically conductive length of material is encapsulated by insulative material. In some embodiments, this can be in efforts to mimic a wire.

In embodiments, a curing process for the conductive material may be included. In embodiments, this may include laser sintering, or any other kind of fusion process for the optical material.

Furthermore, in embodiments, the channels may be machined, e.g., through CNC or any feasible machining methods, as opposed to 3D printed. Alternatively, the channels may be created through a vacuum pump, and/or laser ablation, and the process can continue as previously described.

After such an electrical conduit has been printed, and fully encapsulated, general device printing can resume. This can include formation of any number of additional electrical conduits as is feasible. Thus, in some cases, one or more integrated electrical conduit can be printed, instead of installed.

In embodiments, alternative to a conductive line, an optical line may be printed. In embodiments, the optical line may be a waveguide, a fiber optic channel, or any other structure or material capable of guiding light.

In embodiments, this may entail selecting materials with specific refractive indices and optical transparencies are chosen. Materials for the surrounding 3D structure may be selected based on mechanical and thermal properties to ensure compatibility with the optical materials.

Similar to placing a conductive line, the additive manufacturing process may begin with the deposition of the first layer of the part structure. When the layer reaches the point where the optical line is to be integrated, the optical line may be printed layer-by-layer, in sync with the 3D structure, ensuring that it is fully embedded within (as was previously discussed). The printer may continue to alternate between the structural and optical materials as needed, based on a digital model.

Similar to above, in embodiments, a curing process for the optical material may be included. In embodiments, this may include laser sintering, or any other kind of fusion process for the optical material.

Furthermore, in embodiments, the channels may be machined, e.g., through CNC or any feasible machining methods, as opposed to 3D printed. Alternatively, the channels may be created through a vacuum pump, and/or laser ablation, and the process can continue as previously described.

In embodiments, the materials forming the conductive and/or optical lines may be printed via any metallic, or non-metallic additive manufacturing process, including those discussed previously. For example, ultrasonic additive manufacturing (UAM), selective laser sintering (SLS), selective laser melting (SLM), electron beam melting (EBM), binder jetting (BJ), material jetting (MJ), stereolithography (SLA), fused deposition modeling (FDM), or any other similar method of metallic, or non-metallic additive manufacturing process may be used.

Regardless of how accomplished, in some embodiments, the electrical communications conduit(s) connecting one or more sensor elements and the sensor can be routed through internal cavities of the substrate support device, thus protecting and isolating electrical components that may benefit from not being exposed to the load lock chamber conditions, FI conditions, transfer chamber conditions, etc. that the device is within. Furthermore, in such a way, electrical components, communications conduit(s), wire(s), and sensor(s) associated with the substrate support device can be placed in locations that would be inaccessible after formation of the device. In such a way, new designs and placements of flow structures, electrical components, communications conduit(s), wire(s), and/or sensor(s) may be created or enabled by additive manufacturing, which may be impossible through use of traditional (non-additive) manufacturing methods.

In some embodiments, the method of additive manufacturing for the substrate support device can include one, or any combination of, ultrasonic additive manufacturing (UAM), selective laser sintering (SLS), selective laser melting (SLM), electron beam melting (EBM), binder jetting (BJ), material jetting (MJ), or any other similar method of metallic additive manufacturing. In embodiments, the substrate support device and/or cooling plate can be manufactured in any orientation feasible (e.g., horizontal, vertical, or any orientation with respect to the substrate support device and/or cooling plate etc.).

In some embodiments of the substrate support device the material that the substrate support device is made out of (as discussed above) can include a metal that is initially in the form of a powder or a sheet. The powder or sheet may include, but not limited to, stainless steel alloy(s), aluminum, aluminum alloy(s), titanium, titanium alloy(s), cobalt chrome alloy(s), nickel alloy(s), or any other type or metal or metal alloy commonly used in metallic additive manufacturing.

In other embodiments, the device can be formed through additive manufacturing and from a durable plastic and/or polymer, such as a nylon or polycarbonate, or any other suitable non-metallic and durable material commonly used in additive manufacturing. The material may also be any material previously discussed.

In some embodiments, some portions of the substrate support device (e.g., some portions of a cooling plate) are formed of a 3D printed metal, and other portions of the substrate support device (e.g., other portions of a cooling plate) are formed of a 3D printed polymer.

Figure 3A:
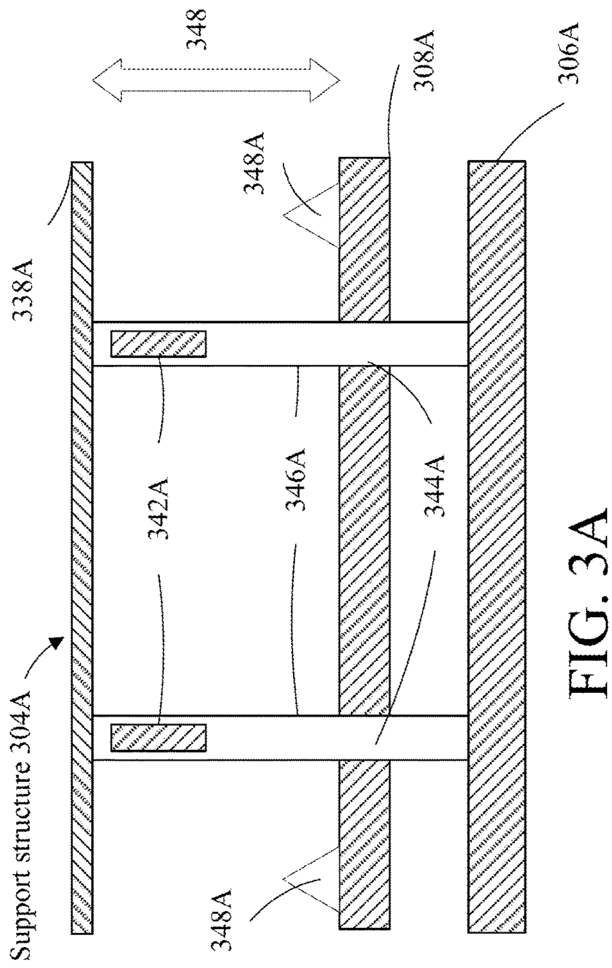
FIG. 3A illustrates a cross-sectional view of exemplary support structure of the substrate support device of FIG. 2A, according to some embodiments of the present disclosure.

FIG. 3A illustrates a cross-sectional view of exemplary support structure of the substrate support device of FIG. 2A, according to some embodiments of the present disclosure.

As seen, FIG. 3A may include support pins 346A extending from the support structure 304A, to support a substrate 338A. In some embodiments, support structure 304A may correspond, or be similar, to either of support structures 204A-B, as seen and described in FIGS. 2A-B, and incorporate and augment at least the embodiments described therein. In some embodiments, support structure base 306A, support structure top surface 308A, substrate 338A, and perforations 344A may correspond, or be similar, to support structure base 206B, support structure top 208A, substrates 138A-B, and perforations 244, as seen and described in FIGS. 1B, and 2A-B. The below disclosure may incorporate and augment at least the embodiments described with respect to FIGS. 1B and 2A-B.

FIG. 3A includes extendable pins 346A that may extend through perforations 344A or holes in substrate support top 308A and support a substrate 338A. In some embodiments, extendable pins 346A may be placed along the surface of the base 306A, and extend a distance 348 from the top surface of the substrate. The pins may be referred to as lift pins.

In embodiments, the lift pins may extend 50 mm above the surface of support structure or cooling plate. In alternate embodiments, the lift pins may extend anywhere between 15 mm to 50 mm, or 30 mm to 70 mm above the surface of support structure or cooling plate.

In embodiments, when actuated, the pins may move from a fully extended position to a fully retracted position within a range of 1 to 1.5 seconds.

In some cases, pins 346A may be exemplary of several pins distributed throughout the support structure 304A. In some cases, any number of pins, including three, four, etc. may be used. Any number of pins as is feasible may be used. In some cases, the pins may be distributed evenly throughout a profile of the support structure. In other cases, they may be distributed around a perimeter of the support structure.

In some cases, pins 346A may be any kind of extending and retracting pins, including, but not limited to pneumatic pins, hydraulic pins, electric pins, mechanical pins, spring loaded pins, and so on and so forth. One of ordinary skill in the art, having the benefit of this disclosure, will appreciate that numerous layouts, types, amounts, and configurations for pins 346A exist, and that FIG. 3A as seen is an exemplary representation of a set of extendable pins associated with the system.

In some embodiments, the pins may retract so that the substrate is supported by support points 348A. As previously discussed with respect to FIG. 2A, support points may be physical protrusions or support structures that may rise to directly contact, and support, a substrate. In some embodiments, the pins 346A may retract until a substrate is resting on support point 348A. In some embodiments, the support points may be retractable as well. In some embodiments, the support points may be materials or equipment with the thermal tolerance capabilities to contact what may be a substrate with a high internal temperature. For example, as was previously discussed, support points, may be, or include, ceramic spheres that are inset into the top surface of the support structure top 208A.

Figure 3B:
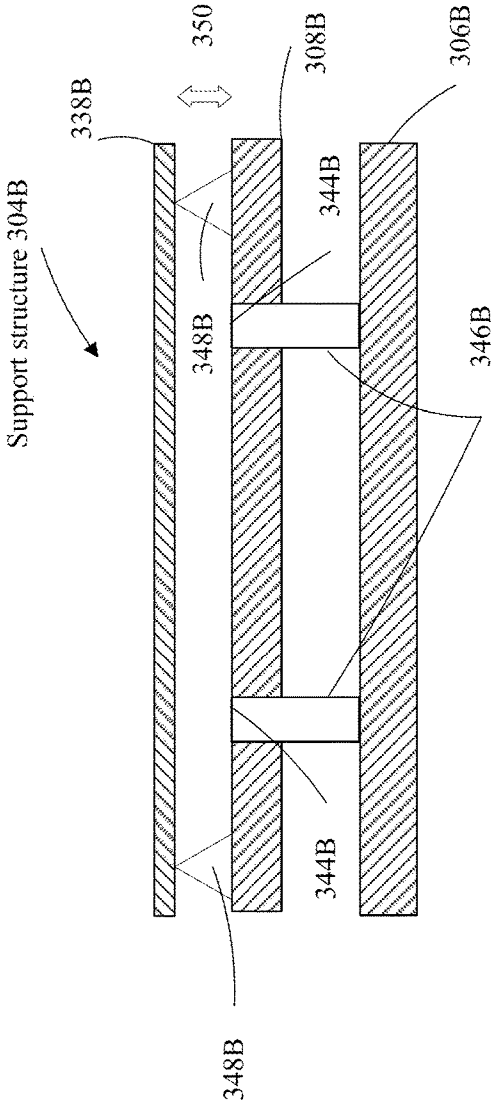
FIG. 3B illustrates a cross-sectional view of exemplary support structure of the substrate support device of FIG. 2A, according to some embodiments of the present disclosure.

Thus, in some embodiments, a substrate may not rest directly on the top surface of a support structure, but a distance above, which the support points protrude to. In some embodiments, the support points rise, and a substrate may be supported, a distance 350 (as is seen in FIG. 3B) above the top surface of a substrate support top. As previously discussed, this distance 350 may be 0.02 inches. In other embodiments, a substrate may be supported, 0.03 inches above the top surface of a substrate support top. In other embodiments, a substrate may be supported anywhere between 0.01 and 0.05 inches above the top surface of a substrate support top.

In some embodiments, the pins may include sensors 562A within, or substantially within the pins 346A. Sensors 342 may extend and retract together with movement of the pins. In some embodiments, sensors 562A may be within a portion of the pins that contact or support the substrate.

Sensors 562A may be temperature sensors of any kind as commonly used within an electronic device manufacturing system. Such types of sensors as may be included by sensors 562A include contacting temperatures sensors. Further embodiments, types, and configurations of these types of sensors will be further described with respect to FIG. 7 below. The disclosure and embodiments with respect to temperature sensors will apply to sensors 562A as well.

FIG. 3B illustrates a cross-sectional view of exemplary support structure of the substrate support device of FIG. 2A, according to some embodiments of the present disclosure.

As seen, FIG. 3B shows an embodiment with pins 346B (which may correspond, or be similar to pins 346A of FIG. 3A and incorporate at least the embodiments described therein), in a retracted state. In some embodiments, support structure 304B may correspond, or be similar, to either of support structures 204A-B, as seen and described in FIGS. 2A-B, and incorporate and augment at least the embodiments described therein. In some embodiments, components associated with support structure 304B, such as support structure base 306B, support structure top surface 308B, and perforations 344B may correspond, or be similar, to support structure base 206B, support structure top 208A, and perforations 244 as seen and described in FIGS. 2A-B. Such components may incorporate and augment at least the embodiments described with respect to FIGS. 2A-B.

As was previously discussed, pins 346B may retract through perforations in the support structure top 308B, leaving a substrate (e.g., 338B) to rest on support points 348B.

In some embodiments, support points 348B may be exemplary of several support points distributed throughout the support structure top 308B. In some cases, any number of support points, including three, four, etc. may be used. Any number of support points as is feasible may be used. In some cases, the support points may be distributed evenly throughout a profile of the support structure. In other cases, they may be distributed around a perimeter of the support structure.

In some cases, support points 348B may be any kind of support points, including ceramics, metals, silicones, glass, or any other kind of material commonly used to support hot substrates within an electronic device manufacturing system. One of ordinary skill in the art, having the benefit of this disclosure, will appreciate that numerous layouts, types, amounts, and configurations for support points 348B exist, and that FIG. 3B as seen is an exemplary representation of a set of support points associated with the system.

FIG. 4A illustrates a perspective view of an exemplary manifold of the support structure of FIG. 2B, according to some embodiments of the present disclosure.

As seen, FIG. 4A illustrates a first and a secondary manifold 434A-1 and 434A-2 for providing and collecting coolant from attached support structures (not shown). In some embodiments, manifold 434A-1,2, and internal flow paths 431A-1,2 and 433A-1,2 may correspond, or be similar, to manifold 234 and internal flow paths 231 and 233 as seen and described in FIGS. 2A-B, and incorporate and augment at least the embodiments described therein. In some embodiments, manifold 434A-1 and 434A-2 are portions of a single monolithic manifold.

In some embodiments, FIG. 4A can illustrate a modular capability of the manifold, when it is manufactured in an additive manner. For example, the bottom surface of manifold 434A-1 may be 3D printed to correspond, or match, with the top surface of manifold 434A-2, and so fluidly seal together. In such a way, multiple manifolds and/or support structures can be modularly combined. In some embodiments, any number of manifolds and/or corresponding support structures may be combined, as is feasible given the weight and fluid flow requirements.

In some embodiments, a single manifold may include more than one fluid inlet, and more than one fluid outlet, so as to support pressure and heat extraction capabilities for numerous support structures. In some embodiments, the manifold and support structure may be additively manufactured as one monolithic piece. This may limit the need for connection points, and remove possible vulnerabilities for water leakage.

Although FIG. 2A illustrates the flow input and output conduits leading from the top surface of a manifold, in practice the flow conduits may be arranged in any feasible manner. For example, in some embodiments, the input and output flow conduits may enter a manifold from underneath. In some cases, the flow conduits may enter a manifold from a side of the manifold. One of ordinary skill in the art, having the benefit of this disclosure, will appreciate that numerous layouts and configurations for manifolds and flow conduits exist, and that FIGS. 2A and 4A as seen are exemplary representation of manifolds associated with the system.

FIG. 4B illustrates a top-down view of exemplary manifold of the support structure of FIG. 2B, according to some embodiments of the present disclosure.

Manifold 434B may correspond, or be similar, to any of manifolds 434A-1, 434A-2, or 234 as were described in FIGS. 2A and 4A, and incorporate and augment at least the embodiments described therein.

As such, manifold 434B may include an internal input flow path 431B and an internal output flow path 433B. A pressure sensor 452 may be connected to both internal flow paths through channels 454 and 456. As such, pressure sensor 452 may be able to sense the pressure differential between the internal input flow path and the internal output flow path of the manifold.

One or more manifold may have one or more such pressure differential sensors. In some embodiments the pressure sensors may be external to the manifold, in others, a pressure sensor may be integrated to the manifold, and may be internal.

Figure 4C:
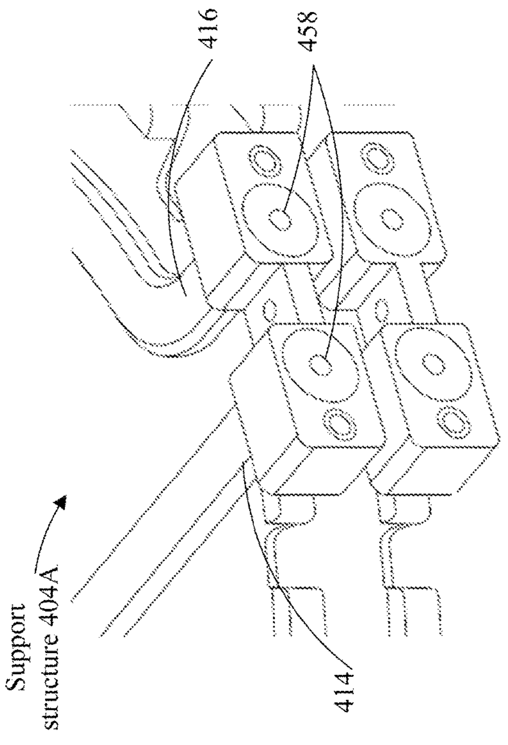
FIG. 4C illustrates a perspective view of exemplary fluid passageways of the support structure of FIG. 2B, according to some embodiments of the present disclosure.

FIG. 4C illustrates a perspective view of exemplary fluid passageways of the support structure of FIG. 2B, according to some embodiments of the present disclosure.

Support structure 404A of FIG. 4C may correspond, or be similar to, support structures 304A-B, or 204A-B, as seen and described in FIGS. 2A-3B.

In some embodiments, the fluid inlet 414 and fluid outlet 416 of support structure 404A may be manufactured to engage with corresponding portion of a manifold. For example, inlet 414 and outlet 416 may include portions 458 to accommodate O-ring insertions. These portions 458 may be intended to align with transfer portions of a manifold, as will be further seen and described in FIG. 4D.

Figure 4D:
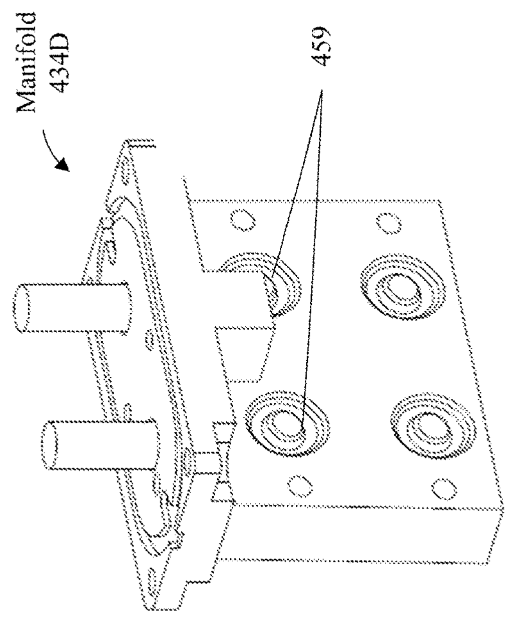
FIG. 4D illustrates a perspective view of exemplary manifold of the support structure of FIG. 2B, according to some embodiments of the present disclosure.

FIG. 4D illustrates a perspective view of an exemplary manifold of the support structure of FIG. 2B, according to some embodiments of the present disclosure.

Manifold 434D may correspond, or be similar to, any of manifolds 434A-1, 434A-2, 434B, or 234 as were described in FIGS. 2A and 4A, and incorporate and augment at least the embodiments described therein.

In some embodiments, a manifold 434D may include transfer regions 459 for engaging with the portion 458 of a support structure. This engagement may form a fluid seal for coolant to flow to and from the support structure.

Figure 5B:
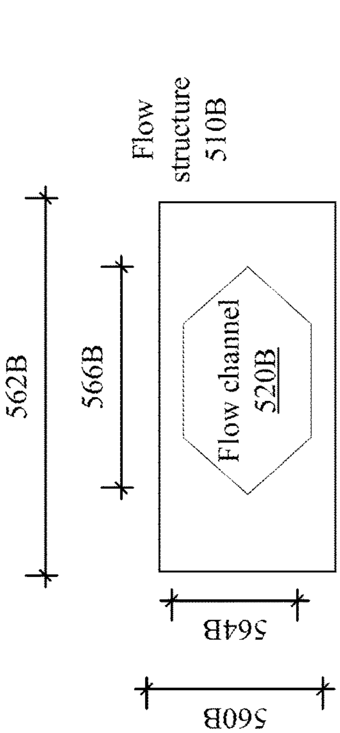
FIG. 5B illustrates a cross-sectional view of an example flow structure of the support structure of FIG. 2B, according to some embodiments of the present disclosure.
Figure 5D:
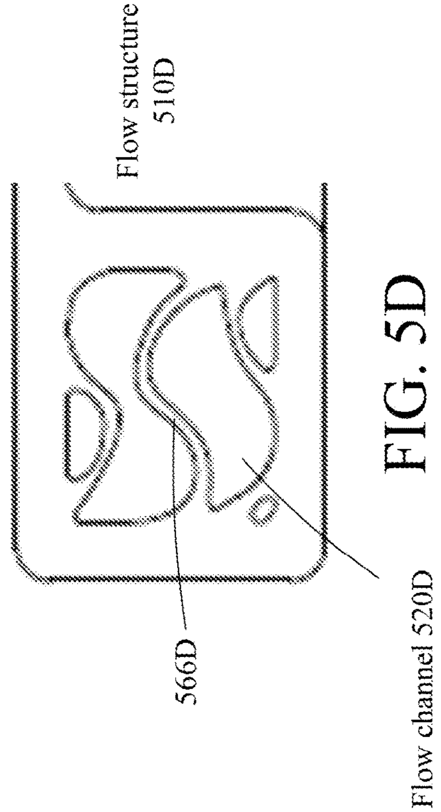
FIG. 5D illustrates a cross-sectional view of an example flow structure of the support structure of FIG. 2B, according to some embodiments of the present disclosure.
Figure 5A:
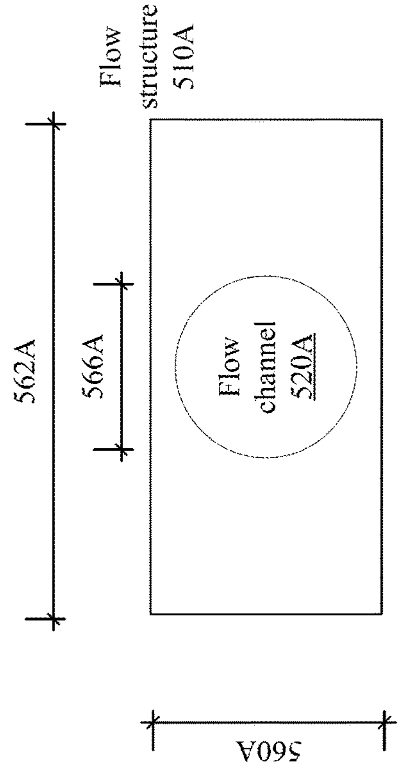
FIG. 5A illustrates a cross-sectional view of an example flow structure of the support structure of FIG. 2B, according to some embodiments of the present disclosure.

FIG. 5A illustrates a cross-sectional view of an example flow structure (e.g., cooling channel) of the support structure of FIG. 2B (e.g., of a cooling plate), according to some embodiments of the present disclosure.

Flow structure 510A, as seen in FIG. 5A, may include and a flow channel 520A. In some embodiments, flow structure 510A and flow channel 520A may correspond, or be similar, to flow structure 210B and/or 210C, and flow channel 220 as seen and described in FIGS. 2B-C, and incorporate and augment at least the embodiments described therein.

In some embodiments, FIG. 5A may include a side view of a flow structure 510A that includes a flow channel 520A that has a circular cross-sectional shape. In some embodiments, flow structure 510A may have a cross-sectional dimension in the X direction (from the left sidewall to the right sidewall), of 562A. In some embodiments, flow structure 510 may have a dimension in the Y direction (from the support structure base to the support structure top) of 560A. In some embodiments, the circular flow channel 520A may have a diameter of 566 A.

In some embodiments, 566A may be 4 mm. In some embodiments, 566A may be between 2 mm and 6 mm. 560A and 562A may be any suitable dimensions.

FIG. 5B illustrates a cross-sectional view of an example flow structure of the support structure of FIG. 2B, according to some embodiments of the present disclosure.

Flow structure 510B, as seen in FIG. 5B, may include a flow channel 520B. In some embodiments, flow structure 510B and flow channel 520B may correspond, or be similar, to flow structure 210B and/or 210C, and flow channel 220 as seen and described in FIGS. 2B-C, and incorporate and augment at least the embodiments described therein.

In some embodiments, FIG. 5B may include a flow structure 510B that includes a flow channel 520B that is hexagonal. In some embodiments, flow structure 510B may have a dimension in the X direction (from the left sidewall to the right sidewall), of dimension 562B. In some embodiments, flow structure 510B may have a dimension in the Y direction (from the support structure base to the support structure top) of dimension 560B. In some embodiments, flow channel 520B may have a dimension in the X direction (from the left sidewall to the right sidewall), of dimension 566B. In some embodiments, the hexagonal flow channel 520B may have a dimension in the Y direction of dimension 564B.

In some embodiments, dimension 564B may be 4 mm. In some embodiments, dimension 564B may be between 2 mm and 6 mm.

In some embodiments, dimension 566B may be 12 mm. In some embodiments, dimension 566B may be between 6 mm and 18 mm.

Dimensions 560B and 562B may be any suitable dimensions.

Figure 5C:
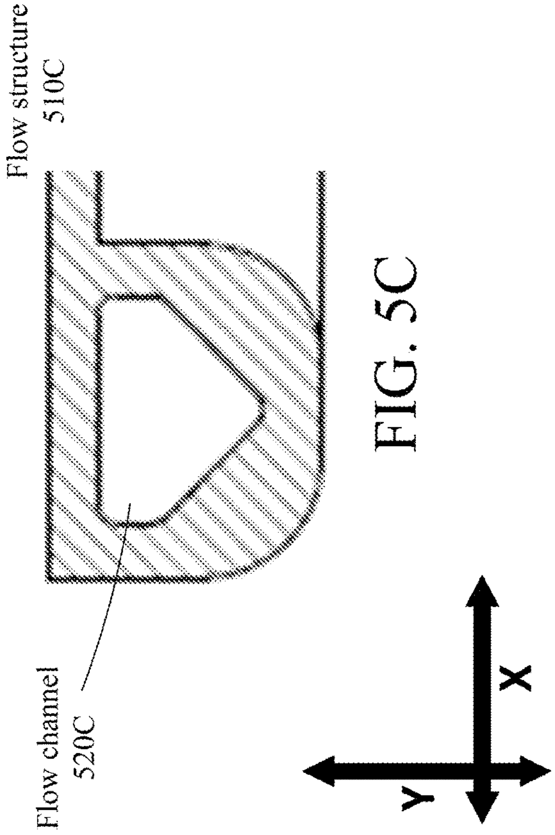
FIG. 5C illustrates a cross-sectional view of an example flow structure of the support structure of FIG. 2B, according to some embodiments of the present disclosure.

FIG. 5C illustrates a cross-sectional view of an example flow structure of the support structure of FIG. 2B, according to some embodiments of the present disclosure.

Flow structure 510C, as seen in FIG. 5C, may include and a flow channel 520C. In some embodiments, flow structure 510C and flow channel 520C may correspond, or be similar, to flow structure 210B and/or 210C, and flow channel 220 as seen and described in FIGS. 2B-C, and incorporate and augment at least the embodiments described therein.

In some embodiments, FIG. 5C may include a side view of a flow structure 510C that includes a flow channel 520C that has a pentagonal cross-sectional shape. In some embodiments, the flow channel 520C may measure between 8 mm and 12 mm in the X direction. In some embodiments, the flow channel may measure between 6 mm and 10 mm in the Y direction. In some embodiments, the flow channel 520C may be spaced a distance of between 2 mm and 3 mm from the top surface of the corresponding support structure.

FIG. 5D illustrates a cross-sectional view of an example flow structure of the support structure of FIG. 2B, according to some embodiments of the present disclosure.

Flow structure 510D, as seen in FIG. 5D, may include and a flow channel 520D. In some embodiments, flow structure 510D and flow channel 520D may correspond, or be similar, to flow structure 210B and/or 210C, and flow channel 220 as seen and described in FIGS. 2B-C, and incorporate and augment at least the embodiments described therein.

In some embodiments, FIG. 5D may include a side view of a flow structure 510D that includes a flow channel 520D that has a gyroid structure 566D within the channel 520D. In some embodiments, the gyroid structure may facilitate heat transfer into the coolant. In some embodiments, the geometry of the gyroid structure is optimized to increase surface area contact between the flow structure and the coolant, thus enhancing heat dissipation and enabling more efficient cooling.

In some embodiments, the flow channel 520D may measure between 8 mm and 12 mm in the X direction. In some embodiments, the flow channel may measure between 8 mm and 12 mm in the Y direction. In some embodiments, the flow channel 520D may be spaced a distance of between 2 mm and 3 mm from the top surface of the corresponding support structure.

One of ordinary skill in the art, having the benefit of this disclosure, will appreciate that numerous layouts, geometries, and configurations for the gyroid structure exists. One of ordinary skill in the art, having the benefit of this disclosure, will appreciate the possibility of incorporating prominent structures such as a gyroid lattice, swartzite lattices, or diamond or fractal lattices, and so on and so forth. As such, it is appreciated that multiple embodiments of the above disclosure can exist, and that gyroid structure 566D as seen and described in FIG. 5D is an exemplary representation of internal heat transfer structures associated with the system.

Figure 6B:
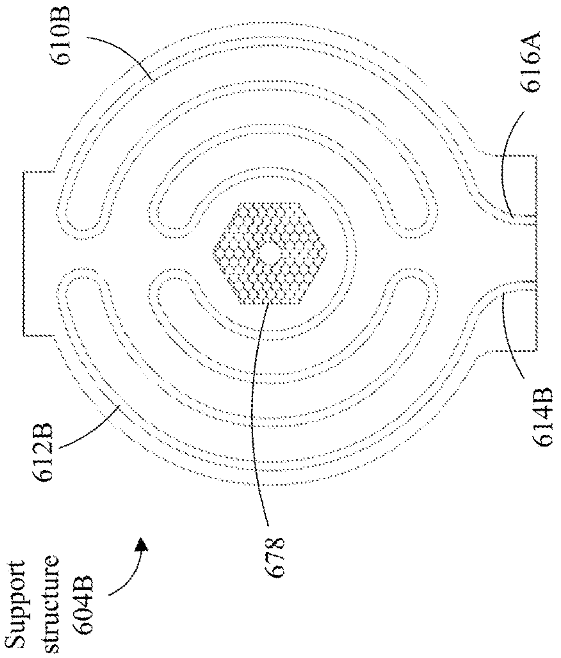
FIG. 6B illustrates a top-down view of an example flow structure of the support structure of FIG. 2B, according to some embodiments of the present disclosure.
Figure 6C:
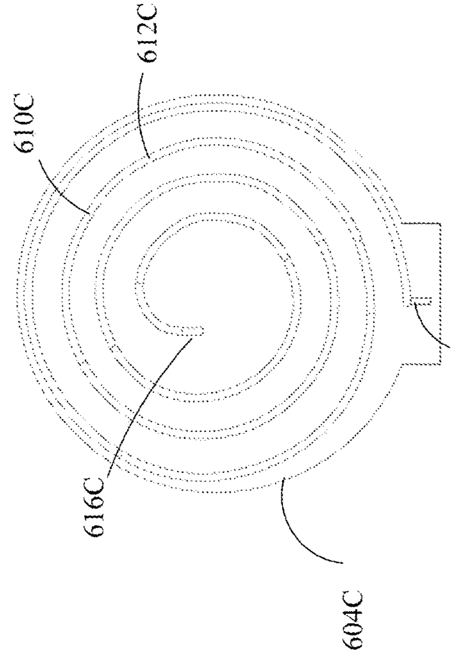
FIG. 6C illustrates a top-down view of an example flow structure of the support structure of FIG. 2B, according to some embodiments of the present disclosure.
Figure 6A:
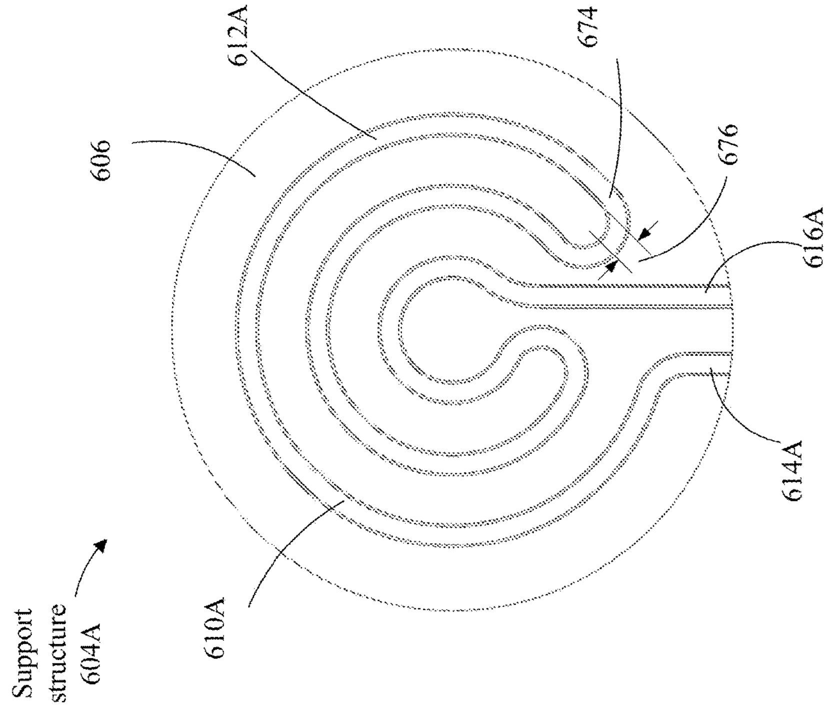
FIG. 6A illustrates a top-down view of an example flow structure of the support structure of FIG. 2B, according to some embodiments of the present disclosure.

FIG. 6A illustrates a top-down view of an example flow structure of the support structure of FIG. 2B, according to some embodiments of the present disclosure.

As seen in FIG. 6A, Support structure 604A may include a flow structure 610A having a flow structure path. In some embodiments, flow structure 610A, flow structure path 612A, and support structure 604A may correspond, or be similar, to flow structures 210B, 210C, 310A, 310B, and/or 3310C, flow structure path 212, and support structures 204A, 204B, as seen and described in FIGS. 2A-C and FIG. 3, and incorporate and augment at least the embodiments described therein.

In some embodiments, FIG. 6A may include a flow structure 610A that includes a flow structure path 612A disposed within a support structure 604A. As was previously discussed with respect to FIG. 2B, the flow structure path may be a path for coolant to circulated throughout an inner volume of the support structure.

In some embodiments, the flow structure path 612A may include one or more curves, or curvatures, as seen in flow structure curvature 674 and flow structure curvature radius 676 of that curvature. As previously discussed, in some embodiments, the flow structure's curvature and corresponding curvature radius may be influenced by various factors including the type of coolant utilized and the materials from which the flow structure is made.

For instance, certain coolants may possess specific thermal or flow characteristics that necessitate a particular curvature or curvature radius to achieve optimal heat transfer efficiency. Furthermore, the radius of curvature of a bend or curve within the flow path may be limited by abrasives within the coolant, to prevent accumulation of abrasives at a bend, or curve. Special attention may be given to the radius of curvature for any bends or curves within the flow structure path, so as to mitigate particle accumulation at those locations.

For example, if a radius of curvature is too narrow, this might serve as a deposition point for abrasives within the flowing coolant, leading to clogs or impeded flow over time. If the radius of curvature is too large, this may be limiting to efficient traversal of the inner volume of the support structure, and limit heat transfer as well. Thus, by optimizing the radius of curvature, the flow path can be designed to maintain a smooth and uninterrupted flow of coolant, while maximizing the overall efficacy of the cooling systems capabilities.

In some embodiments, as seen in FIG. 4A, the flow structure curvature radius 676 may between the range 6 mm to 8 mm for curvature 674. In some embodiments, the same range may be applied to all curvatures within a flow structure of a support structure. For example, in other embodiments, the flow structure curvature radius 676 may be between 5 mm and 9 mm, or 3 mm and 12 mm, or 3 mm and 15 mm, and such limits may restrict every flow structure curvature of the flow structure path. By thus optimizing the radius of curvature, a smooth and uninterrupted flow of coolant may be maintained. An added benefit is that the flow structure may uniformly traverse the interior of the support structure, and has access to heat relief capabilities. In some embodiments, no point on the surface of a substrate top is ever further that 900 mm from the nearest portion, or channel, of the flow structure of the substrate support that is circulating coolant. Thus, through such a precautionary design, part maintenance, part wear, and overall system degradation can be reduced.

FIG. 6B illustrates a top-down view of an example flow structure of the support structure of FIG. 2B, according to some embodiments of the present disclosure.

Flow structure 610B, as seen in FIG. 6B may include flow structure path 612B, and support structure 604B. In some embodiments, flow structure 610B and support structure 604B may correspond, or be embodiments of, flow structures 210B, 210C, 310A, 310B, and/or 3310C, flow structure path 212, and support structures 204A, 204B, as seen and described in FIGS. 2A-C and FIG. 3, and incorporate and augment at least the embodiments described therein. In some embodiments, FIG. 6B, may include one or more similar flow structure curvatures and one or more flow structure curvature radii, as were discussed with respect to FIG. 6A, and incorporate and augment at least the embodiments described therein.

In some embodiments, flow structure path 612B may be an embodiment of a flow structure path as previously seen and described. For example, when compared to FIG. 4A, and flow structure path 612A, flow structure path 612B may include more curves, and one or more solid spaces of the outer circumference of the support structure that the flow structure path 612B does not cross. As described with respect to FIG. 2B, support structure 604B may include a honeycomb structure 678 within the body of the support structure. In some embodiments, such a honeycomb structure may aid in structural integrity, reduction of vibrations, and heat dissipation. In some embodiments, such a structure may be included in any portion of the support structure, e.g., the support structure base, the space between the base and the top, or the support structure top.

FIG. 6C illustrates a top-down view of an example flow structure of the support structure of FIG. 2B, according to some embodiments of the present disclosure.

Flow structure 610C, as seen in FIG. 6C, includes flow structure path 612C and support structure 604C. In some embodiments, flow structure 610C and support structure 604C may correspond to, or be embodiments of, flow structures 210B, 210C, 310A, 310B, and/or 3310C, flow structure path 212, and support structures 204A, 204B, as seen and described in FIGS. 2A-C and FIG. 3, and incorporate and augment at least the embodiments described therein. In some embodiments, FIG. 6C, may include one or more similar flow structure curvatures and one or more flow structure curvature radii, as were discussed with respect to FIG. 6C, and incorporate and augment at least the embodiments described therein.

In some embodiments, flow structure path 612C may be an embodiment of a flow structure path as previously seen and described. For example, when compared to FIGS. 6A-B, and flow structure path 612A-B, flow structure path 612C may include no curves, or curves of very large radii, as the flow structure path 612B includes a spiral-like shape, or a shape that approximates a spiral.

Figure 6E:
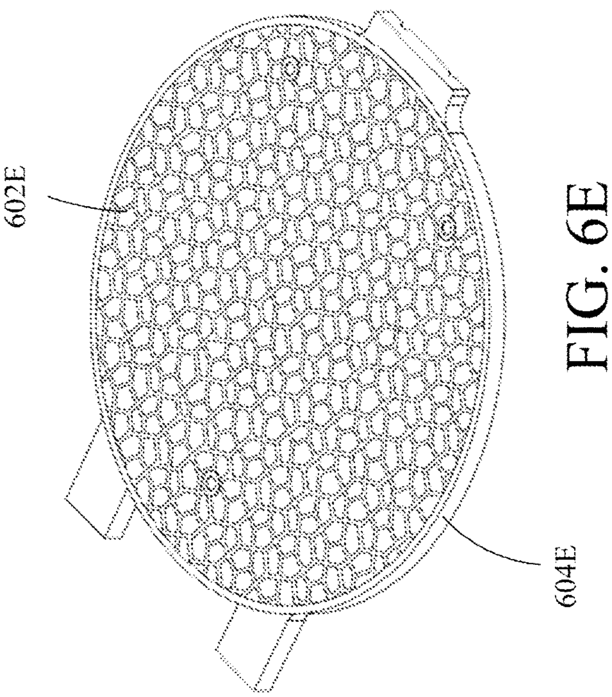
FIG. 6E illustrates a perspective view of an example rib structure of the support structure of FIG. 2B, according to some embodiments of the present disclosure.
Figure 6F:
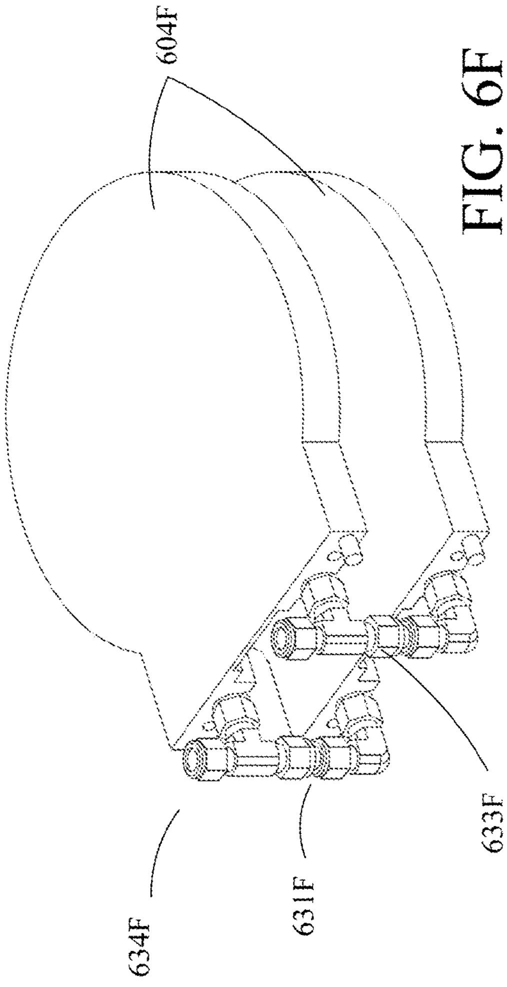
FIG. 6F illustrates a perspective view of exemplary manifold of the support structure of FIG. 2B, according to some embodiments of the present disclosure.
Figure 6D:
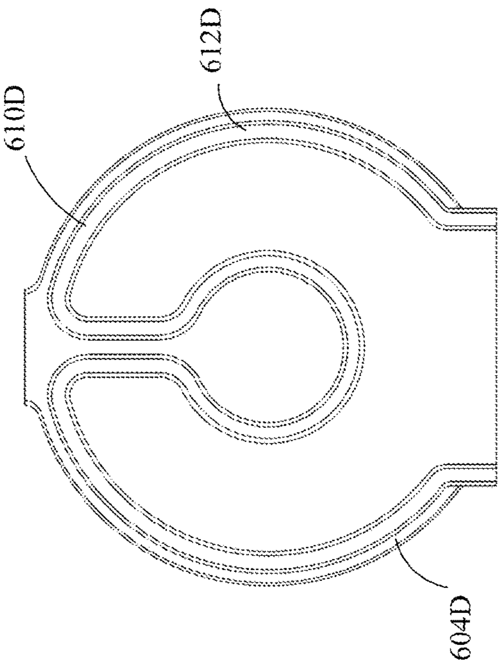
FIG. 6D illustrates a top-down view of an example flow structure of the support structure of FIG. 2B, according to some embodiments of the present disclosure.

FIG. 6D illustrates a top-down view of an example flow structure of the support structure of FIG. 2B, according to some embodiments of the present disclosure.

Flow structure 610D, as seen in FIG. 6D, includes flow structure path 612D and support structure 604D. In some embodiments, flow structure 610D and support structure 604D may correspond to, or be embodiments of, flow structures 210B, 210C, 310A, 310B, and/or 3310C, flow structure path 212, and support structures 204A, 204B, as seen and described in FIGS. 2A-C and FIG. 3, and incorporate and augment at least the embodiments described therein. In some embodiments, FIG. 6D, may include one or more similar flow structure curvatures and one or more flow structure curvature radii, as were discussed with respect to FIG. 6D, and incorporate and augment at least the embodiments described therein.

In some embodiments, flow structure path 612D may be an embodiment of a flow structure path as previously seen and described. For example, when compared to FIGS. 6A-C, and flow structure path 612A-C, flow structure path 612D may include wider curves, or curves of very large radii.

Thus, as seen and described with respect to FIGS. 6A-D, a flow structure path of a flow structure and support structure may have a unique shape, or pattern, for traversing an interior volume of a support structure. As discussed, unique shapes, patterns, curvatures, and curvature radii, etc., may offer tradeoffs and unique characteristics impacting flow, heat transfer, heat extraction, and manufacturability.

Furthermore, as was previously discussed with respect to FIG. 2B, a flow structure path of the system may be circular and contain curves and curvatures as the flow structure path traverses the inner volume. In other embodiments, a flow structure path may be a different path, such as a spiral, a zig zag, line, etc.

In some embodiments, a flow structure path may include curvature of a certain radius of curvature. In some embodiments, a flow structure path may include a certain amount of spacing between itself. In some embodiments, a flow structure path may be circular, or include circular contours. In other embodiments, the flow structure path may be square or include straight contours and 90-degree angles. One of ordinary skill in the art, having the benefit of this disclosure, will appreciate that numerous layouts, curvatures, and contours, for a flow structure path exist, and that flow structure path 612A-C as seen in FIGS. 6A-D are exemplary representations of a flow structure path associated with a flow structure and the system at large.

FIG. 6E illustrates a perspective view of an example rib structure of the support structure of FIG. 2B, according to some embodiments of the present disclosure.

In some embodiments, the example rib structure 602E may be a honeycomb structure disposed within or on the top or bottom layer or surface of the support structure 604E.

FIG. 6F illustrates a perspective view of exemplary manifold of the support structure of FIG. 2B, according to some embodiments of the present disclosure.

As seen, FIG. 6F illustrates a manifold 634F for providing and collecting coolant from attached support structures 604F. In some embodiments, manifold 634F may include flow paths 631F and 633F and may correspond, or be similar, to manifold 234 and internal flow paths 231 and 233 as seen and described in FIGS. 2A-B, and incorporate and augment at least the embodiments described therein.

In some embodiments, a single manifold may include more than one fluid inlet, and more than one fluid outlet, so as to support pressure and heat extraction capabilities for numerous support structures. In some embodiments, any number of fluid inlets and/or outlets and corresponding support structures may be combined, as is feasible given the weight and fluid flow requirements.

In embodiments, manifold 634F of FIG. 6F may include any of the sensors and diagnostics tools as described with respect to FIGS. 4A-D, and incorporate and augment at least the embodiments described therein.

Although FIG. 6F illustrates coolant input and output conduits leading from the top side of a manifold 634F, in practice the flow conduits may be arranged in any feasible manner. For example, in some embodiments, the coolant input and output flow conduits may introduce/remove coolant from the bottom side, or underside of the manifold. In some cases, the flow conduits may enter a manifold from a lateral side. One of ordinary skill in the art, having the benefit of this disclosure, will appreciate that numerous layouts and configurations for manifolds and flow conduits exist, and that FIG. 6F as seen is an exemplary representation of a manifold associated with the system.

Figure 7:
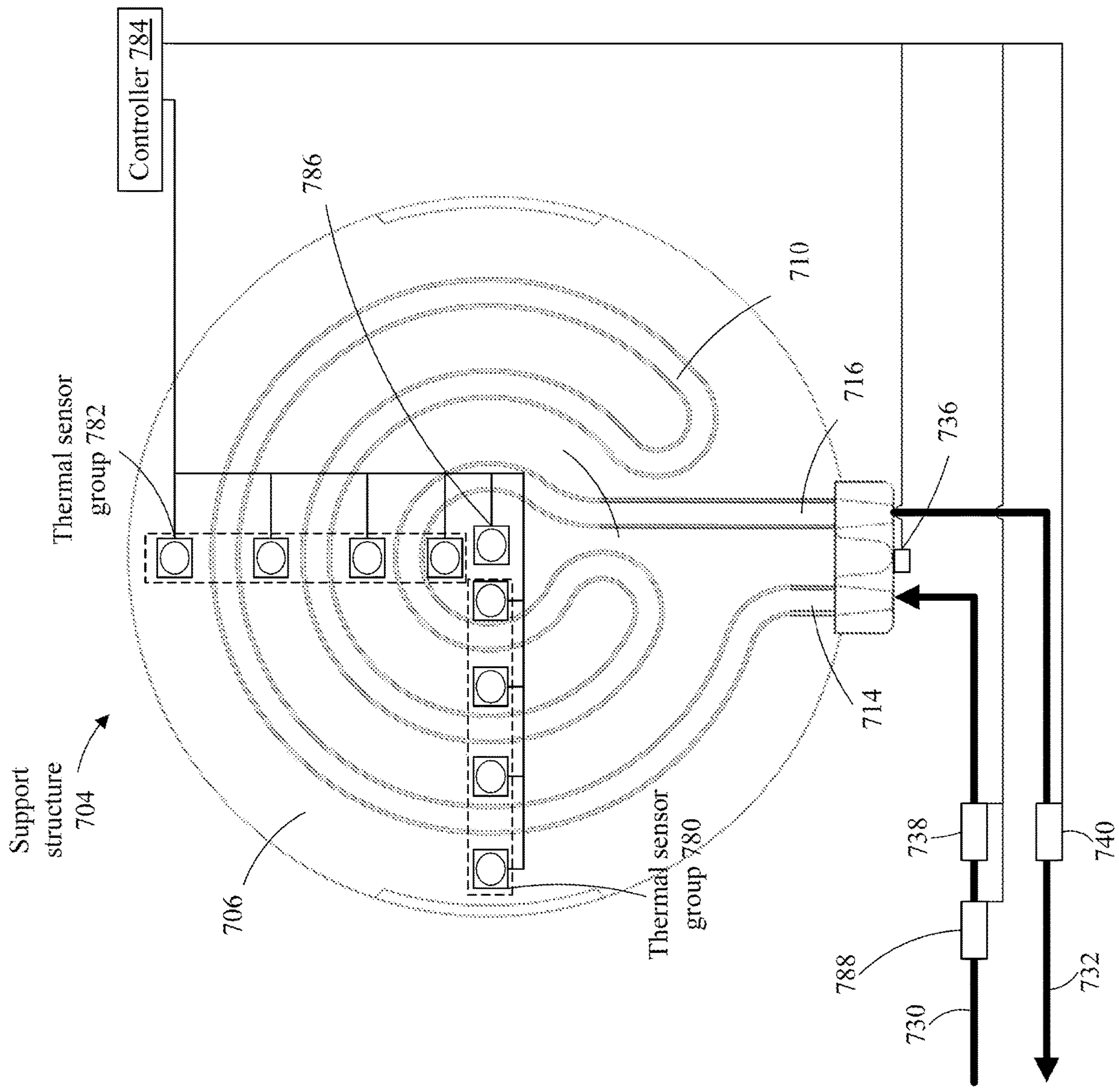
FIG. 7 illustrates an example layout of integrated sensors of the support structure of FIG. 2B, according to some embodiments of the present disclosure.

FIG. 7 illustrates an example layout of integrated sensors of the support structure of FIG. 2B, according to some embodiments of the present disclosure.

Support structure 704, as seen in FIG. 5 may include a flow structure 710, and a flow structure path 712. In some embodiments, the support structure 704, flow structure 710, and flow structure path 712, may correspond to, be similar to, or be an embodiment of support structures 204A, 204B, 404A, 404B, 404C flow structures 210B, 210C, 310A, 310B, 310C, flow structure path 212, 412A. 412B, 412C, as seen and described in FIGS. 2A-C, 3A-C, and 4A-C, and incorporate and augment at least the embodiments described therein.

In some embodiments, support structure 704 may include a flow structure 710, and a flow structure base 706.

Placed within or on flow structure base 706, may be one or more thermal sensor groups 780 and 782 In some embodiments, each sensor group may include one, two three, four, or any number of individual thermal sensors. In some embodiments, group 780 may be for measuring the temperature of a supported substrate. Group 782 may be for measuring the temperature of the cooling fluid within the flow structure 710, or the temperature of the support structure in general. In some cases, the functions and/or placements of the group 780 and 782 may be reversed.

In some cases, a thermal sensor (e.g., of whichever of groups 780 or 782 is used to measure the temperature of a supported substrate), may be placed on the flow structure base 706, and extend until a support structure top (not shown in FIG. 7), but not past the flow structure top. In such an embodiment, the thermal sensor may sense the temperature of a substrate supported by the support structure, through conduction through the support structure top. In other embodiments, the thermal sensor may extend through the support structure top, and directly contact a substrate (not shown in FIG. 7), so to gather more accurate measurements of a temperature of a substrate that is supported by support structure 704. In still other embodiments, the thermal sensor may align with a perforation of the support structure top (as seen in FIG. 2A) granting line-of-sight to the sensor. In such cases, the sensor may engage with the substrate from a distance, to sense the temperature of a supported substrate.

Thus, the thermal sensors of sensor groups 780 and 782 may be one or more of several types. The type may be determined as necessary based on a number of underling physical properties, including the individual sensor placement within support structure 704, available resources, geometric constraints, etc. according to some embodiments of the present disclosure.

In some embodiments, any sensor of either sensor group 780 and 782 may be any sensor known and employed within electronic device manufacturing systems. For example, in light of the aforementioned contextual information, in applications where thermal sensors are placed on the flow structure base and extend until the support structure top, thermocouples may be used for sensing temperature through conduction. In other embodiments, resistive temperature detectors (RTDs) might be used. In embodiments involving line-of-sight, infrared sensors may also be employed to gather temperature data without physical contact, through the support structure top perforations granting direct line-of-sight to the substrate. In other similar embodiments, optical sensors, spectroscopic sensors, acoustic temperature sensors, thermal imaging cameras, or any other kind of non-contacting type of thermal sensor commonly used within a substrate manufacturing system may be employed.

In embodiments where the thermal sensors extend through the support structure top to directly contact the substrate, thin-film temperature sensors may be employed, due to their low profile and capacity to provide surface temperature measurements. Thermistors, may be employed, due to their sensitivity and response times. In further embodiments, fiber optic temperature sensors, thermos couples, solid-state sensors, capacitive temperature sensors, or any other kind of contacting temperature sensor commonly used within substrate manufacturing systems may be used.

Thus, a variety of thermal sensors for thermal sensors groups 780 and/or 782 may be used. The choice of sensor may be dictated by various factors including, but not limited to, the desired level of measurement accuracy, the nature of the support structure, and the specific environmental conditions present. Accommodations for each sensor group and included types of sensors e.g., power sources, communications conduits, structure top perforations, contact points, etc. can exist for the variety of sensor types selected, mutatis mutandis.

In some embodiments, the thermal sensors of any group may be arranged in a linear shape, extending from a circular center to an exterior circumference. This may help produce, or map the temperature profile of a substrate according to concentric rings. In some cases, the supported substrate may include a temperature profile according to such concentric rings. In some cases, the center may be the hottest, with the outermost ring being the least hot.

In other cases, the thermal sensors may be in any other two dimensional or three-dimensional configuration.

In some embodiments, any of the above mentioned, or similar sensors may be used to measure the temperature within the support structure, or the temperature of the coolant. As mentioned, one group may be chosen to measure the temperature of the supported substrate, and another may be chosen to measure the temperature within the support structure. Similar to the disclosure above, any of the proposed sensors of either group may be used in any linear, or non-linear configuration, to sense the temperature of the support structure, or coolant within.

One of ordinary skill in the art, having the benefit of this disclosure, will appreciate that numerous layouts, configurations, shapes, positions, and types of sensors for each sensor and sensor group 780 and 782 exist, and the groups are seen in an exemplary representation of a support structure and sensors configuration.

In some embodiments, the thermal sensors of groups 780 and 782 may provide sensor data to a controller 784 associated with the system. In some embodiments, the controller 784 may be similar, or analogous to controller 150, as seen and described in FIG. 1A, and incorporate and augment at least the embodiments described therein. In some embodiments, the controller may be separate, and dedicated to the specific support structure 704 and corresponding thermal sensors of sensor groups 780 and 782, and flow structure 710.

In some embodiments, controller 784 may implement a control algorithm to monitor and adjust the temperature of the substrate and/or support structure. In some cases, the controller may monitor and adjust the amount, or speed, of flow of coolant through flow structure 710. In some cases, this may be augmented from additional flow, pressure, or temperature sensors (as were described in FIG. 2A). In some embodiments, the controller, may employ any type of control methods, e.g., a PID controller, a feedforward controller, a predictive model, or any other kind of controller commonly used within a substrate manufacturing system may be employed (this may include controllers with machine-learning models).

In some embodiments, the controller may adjust the rate of flow of coolant through the support structure in response to the sensed temperatures of the substrate, so as to monitor and influence the temperature of the substrate. For example, if a substrate is placed onto the support structure, and the substrate temperature is measure as high, the controller may increase the rate of coolant flow. In other embodiments, if the substrate is cooler, the controller may decrease coolant flow. In some embodiments, coolant flow may be stopped altogether.

In embodiments, the controller 784 may communicated with any sensors as previously discussed with respect to FIGS. 2A-6C, and augment and incorporate the embodiments described therein. For example, in some example embodiments, controller 784 may communicate with any version or combination of a moisture sensor, flow rate sensor, pressure sensors, temperatures sensors, etc. as discussed with respect to FIG. 2A, with a pressure sensor as discussed with respect to FIG. 4B, and so on and so forth (incorporating any combination or number of sensors of the current disclosure).

With respect to FIG. 7, in embodiments, any of the above-mentioned sensors or combinations of such, may be integrated (e.g., within the manifold or support structure, etc.), or external (e.g., on a surface of the manifold, clamped on to a fluid conduit leading to/from the manifold, etc.) to the support structure. For example, in embodiments, the controller may gather further information, from one or more flow sensors 738 and/or 740 attached to flow conduits 730 and/or 732. As seen, flow conduits 730 and/or 732 may fluidly connect to flow inlet 714 or flow outlet 716 of support structure 704.

In embodiments, the flow sensors 738 and/or 740 may deliver any combination of pressure, temperature, of flow rate data (as has been previously discussed throughout the specification) to controller 784. In embodiments, sensors 738 and 740 may be attached to flow conduits in any way feasible, and may be clamp on sensors, integral sensors, electronic digital or analog sensors, or mechanical sensors, etc., and augment and incorporate the sensor embodiments as previously discussed throughout the specification. In embodiments, the sensors may be placed closer, or further from flow inlets and outlets. In embodiments, they may be integral to the manifold (not labeled in FIG. 7), or external to the support structure.

Furthermore, in embodiments, the controller may communicate with one or more moisture sensors 736. In embodiments, moisture sensor 736 may correspond, or be similar, to moisture sensor 236 as seen and described with respect to FIG. 2A. As such, moisture sensor 736 may incorporate and augment the embodiments as seen and described with respect to moisture sensor 236 within FIG. 2A.

In embodiments, the controller 784 may communicate and effect flow changes via a flow valve 788. In embodiments, the valve may be any type of valve capable of controlling flow of a coolant, including, but not limited to a diaphragm valve, a ball valve, a solenoid valve, a gate valve, etc., and so on and so forth.

In some embodiments, the controller may act with the support structure to cool a hot substrate to a desired temperature within 40-90 seconds. In some embodiments, the controller may act with the support structure to cool a substrate from above 250 degrees Celsius, to below 100 degrees Celsius, to below 65 degrees Celsius, or to room temperature.

As seen in FIG. 7, proximity sensor 786 of support structure 704 may serve to detect a substrate placed on support structure 704, in some embodiments.

In some embodiments, proximity sensor 786 may reside in or on the support structure base 706. Similar to thermal sensors groups 780 and 782, proximity sensor 786 may be placed on a surface of support structure base 706. Similar to the previous discussion, in some embodiments, proximity sensor 786 may extend until a support structure top (not shown in FIG. 7). In such an embodiment, proximity sensor 786 may sense the presence of a substrate supported by the support structure, through the support structure top. In other embodiments, proximity sensor 786 may extend through the support structure top, and directly contact, or view, a substrate (not shown in FIG. 7), so to more accurately detect a substrate that is supported by support structure 704. In still other embodiments, sensor 786 may be aligned with a perforation, so as to have line-of-sight to the supported substrate. Thus, the type of proximity sensor used in such a case may depend on the context, and placement. In some embodiments, sensor 786 may be any type of sensor commonly used within a substrate manufacturing system. For example, in some embodiments where proximity sensor 786 extends until the support structure top, a capacitive sensor may be deployed. A capacitive proximity sensor may sense the presence of a substrate by detecting changes in an electromagnetic field, which could be altered by the substrate material, without actually contacting the substrate. Similarly, in some embodiments, inductive proximity sensors may also be used, where the presence of a metal portions of substrate may change the inductance of a coil in the sensor, thus signaling the presence of the substrate.

In some embodiments, the proximity sensor 786 is a laser or light-based proximity sensor (e.g., such as a proximity sensor provided by FlightSense™). In some embodiments, the proximity sensor 786 is located at a center of the cooling plate, and is embedded in the cooling plate. In some embodiments, one or more sensor fibers for a cooling sensor are embedded in the cooling plate. Responsive to detection of a substrate by proximity sensor 786, one or more temperature sensors may be triggered.

Temperatures sensors (e.g., thermocouples) as any of the kind described above, may also be used, detecting the heat emitted or reflected by the substrate. In other embodiments, any capacitive sensor, inductive sensor, magnetic sensors, or any other type of non-contacting proximity sensor commonly used within an electronic device manufacturing system may be employed. In embodiments where proximity sensor 786 extends through the support structure top and makes direct contact with, or has direct line of sight to, the substrate, other sensors may be employed. An optical sensor may be employed. Optical sensors may use a light source and a photodetector to detect the presence of a substrate. In similar embodiments, an ultrasonic proximity sensor may be used, sending acoustic waves and measuring the time it takes for the waves to bounce back, thereby confirming the presence of a substrate. Temperatures sensors (e.g., thermocouples) as any described above, may also be used, detecting the heat emitted or reflected by the substrate. In other embodiments, any ultrasonic sensor, optical sensor, IR sensor, or any other type of contacting, or line-of-sight, proximity sensor commonly used within a substrate manufacturing system may be employed.

In some embodiments, the proximity sensor 786 may be placed in the center of the support structure 704, and thermal sensors of groups 780 and 782 may be placed in middle portions of the support structure 704. In other embodiments, any configuration for any of the proximity sensor 786 and/or thermal sensors groups 780 and 782 may be envisioned to accurately and efficiently gather presence and temperature information from a supported substrate. One of ordinary skill in the art, having the benefit of this disclosure, will appreciate that numerous layouts and configurations for the thermal and proximity sensor exist, and that the layout of FIG. 7 as seen is an exemplary representation of thermal and proximity sensors associated with the system.

Figure 8A:
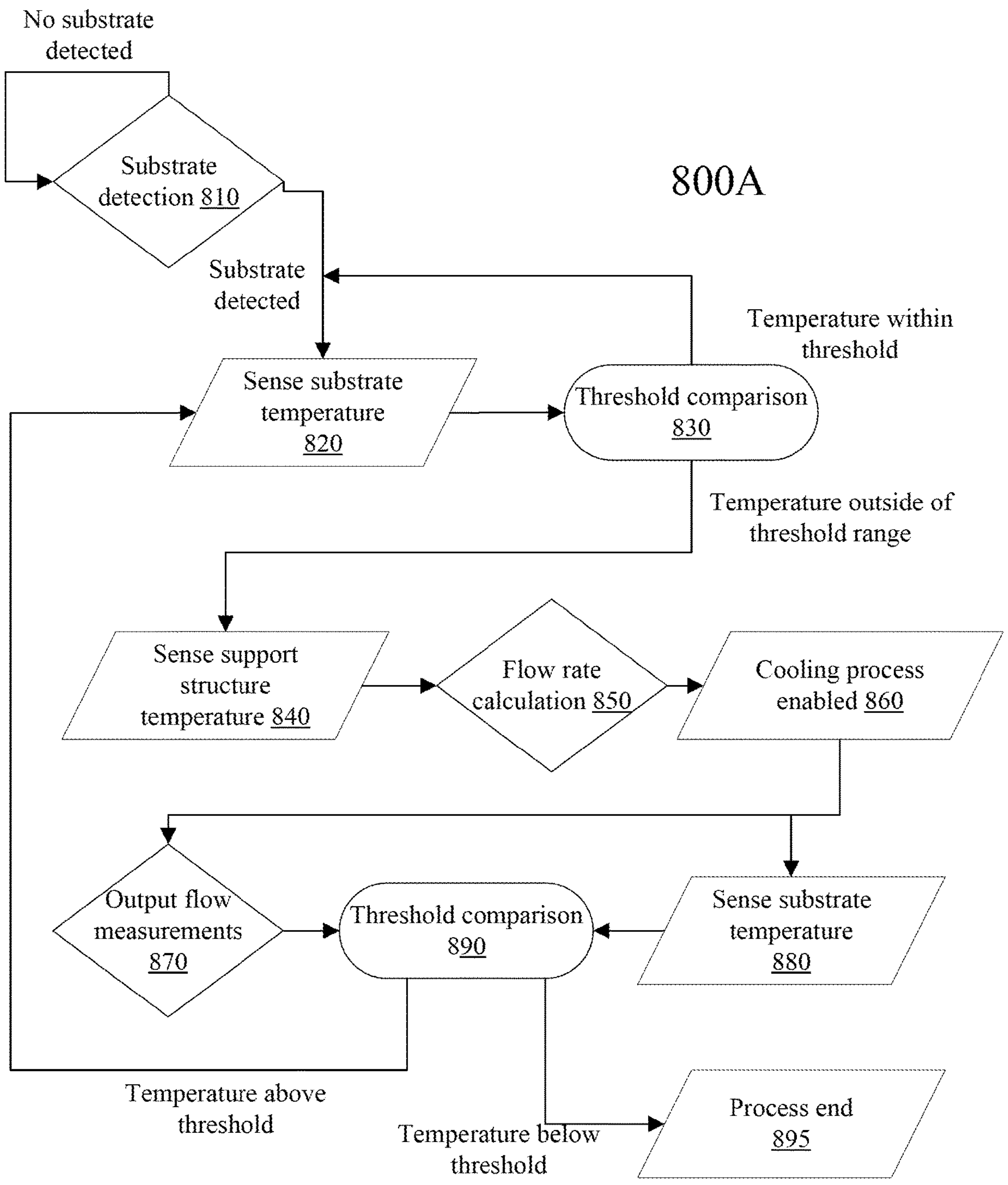
FIG. 8A is a flow diagram of an example method of cooling a substrate via a substrate support device of FIG. 1A, according to some embodiments of the present disclosure.

FIG. 8A is a flow diagram of an example method of cooling a substrate via a substrate support device of FIG. 1B, according to some embodiments of the present disclosure.

In some embodiments, the process 800A as seen in FIG. 8A may be applied using any of the hardware, layouts, and embodiments, as seen and described with respect to the previous FIGS. 1-7.

The process 800A may begin at operation 810, where a substrate has been detected on the support structure. In some embodiments, the substrate may be detected via a proximity sensor as was described in FIG. 7. Once a substrate is detected, the operation may move on to operation 820. If a substrate is not detected, the process may remain at this operation until one is.

At operation 820, once a substrate has been detected, cooling may be activated for a cooling plate. Alternatively, cooling may have already been activated for the cooling plate. Additionally, or alternatively, at operation 820 the temperature of the substrate can be sensed. The temperature of a substrate may be sensed according to any of the sensors and layouts described in FIG. 7. Once the temperature has been sensed, the temperature of the substrate can be compared to a threshold or target. If the temperature is above a threshold, the cooling sequence can be initiated. If the temperature is below the threshold, no cooling sequence may be initiated. In some embodiments, the threshold compared to at operation 830 may be 200, 250, or 300 degrees Celsius. If the cooling sequence is initiated, the process may move to operations 840 and 850.

At operation 840, a temperature of the support structure, and coolant within, can be measured. In some embodiments, the support structure and/or coolant temperature may be sensed with any of the sensors and configurations discussed with respect to FIG. 7.

At operation 850, a controller of the system may calculate a flow rate for the coolant, and cooling process duration, based on the sensed temperatures of the support structure or coolant, and/or the substrate. In some embodiments, a controller such as controller 784, or 150, as described in FIGS. 1 and 7 may be used. In some cases, any of the before-discussed control models, including machine learning models, may be used.

At operation 860, the cooling process may be enabled according to the parameters determined at operation 850. This may include modifying the flow rate of coolant through a flow structure (as flow structures have been previously described) through a support structure.

At the outset of the cooling process and operation 660, the process may gather measurements from both the coolant flow egressing from the support structure, and the substrate (at operation 670 and 680). In some embodiments, the controller may gather pressure and temperature data from the coolant egress flow, and substrate temperature data. Such data may be gathered via any configuration of temperature, pressure, and flow rate sensors as have been described with respect to FIGS. 2-7.

At operation 890, some or all data collected can be compared to a threshold. In some cases, the substrate temperature can be compared to a threshold of 50, 30, or 22 degrees Celsius. If the substrate temperature is above this threshold, the process may return to operation 820. In some embodiments, if the temperature of the egress flow is above a threshold of 50, 30, or 22 degrees Celsius, the process may return to operation 820.

Thus, should the data from the coolant egress flow, and the substrate lay within acceptable ranges, the process ends, at operation 895. Should any of the collected data fall outside the threshold, the process can restart at step 820. Once the process ends, a controller may cause a robot arm to retrieve a now cooled substrate from the substrate support (e.g., from a cooling plate of a cooling station).

Figure 8B:
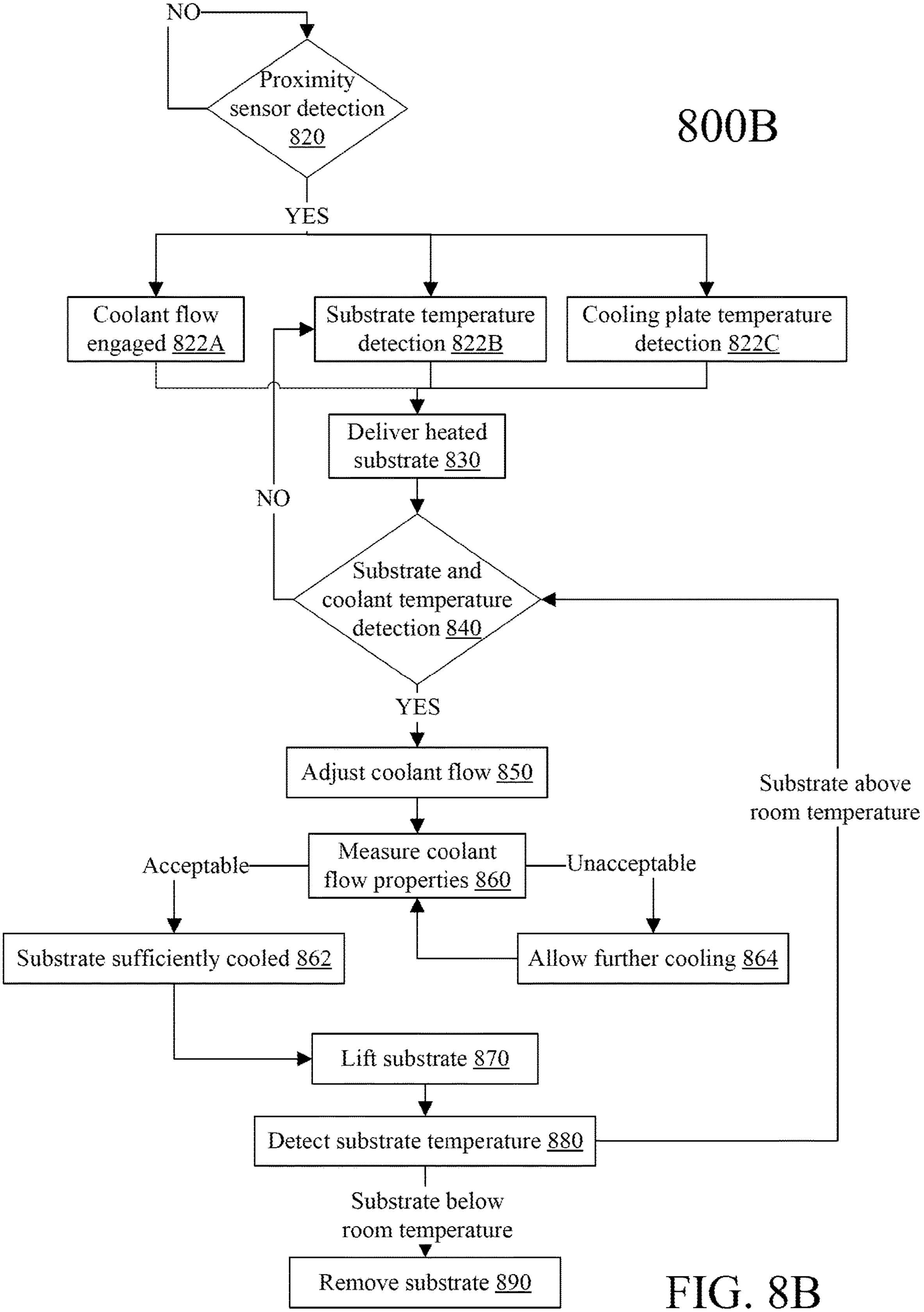
FIG. 8B is a flow diagram of an example method of cooling a substrate via a substrate support device of FIG. 1A, according to some embodiments of the present disclosure.

FIG. 8B is a flow diagram of an example method of cooling a substrate via a substrate support device (e.g., cooling station) of FIG. 1A, according to some embodiments of the present disclosure.

In some embodiments, the process 800B as seen in FIG. 8B may be applied using any of the hardware, layouts, and embodiments, as seen and described with respect to the previous FIGS. 1A-7.

The process 800B may begin at operation 820, where a substrate has been detected above the support structure (e.g., on lift pins as were described with respect to FIGS. 3A-B). In some embodiments, the substrate may be detected via a proximity sensor as was described in FIG. 7. Once a substrate is detected, the operation may move on to operations 822A-C.

At operations 822A-C, the process may simultaneously or in parallel engage coolant flow (operation 822A), detect the substrate temperature such as with an infrared temperature sensor, non-contact temperature sensor and/or contact temperature sensor (e.g., disposed on a lift pin) (at operation 822B), and detect the temperature of the cooling plate (e.g., using a thermocouple temperature sensor or other type of temperature sensor) (at operation 822C).

In embodiments, operation 822A may engage the coolant flow to be a continuous 1 GPM.

In embodiments, at operation 822B, the temperature of the substrate can be sensed. The temperature of a substrate may be sensed according to any of the sensors and layouts described in FIG. 7. Once the temperature has been sensed, the temperature of the substrate can be compared to a threshold or target range. If the temperature is within a threshold range, the cooling sequence can be initiated. If the temperature is above or below the threshold, no cooling sequence may be initiated. In some embodiments, the threshold range compared to at operation 822B may be from 20 to 200, from 10 to 250, or from 10 to 300 degrees Celsius.

In embodiments, at operation 822C, the temperature of the cooling plate and/or coolant may be sensed. The temperature of the cooling plate and/or coolant may be sensed according to any of the sensors and layouts described in FIG. 7. Once the temperature has been sensed, the temperature of the cooling plate and/or coolant can be compared to a threshold or target. If the temperature is below a threshold, the cooling sequence can be initiated. If the temperature is above a threshold, no cooling sequence may be initiated. In some embodiments, the threshold range compared to at operation 822B may be 20, 25, or 30 degrees Celsius.

Should the temperatures at operations 822B-C be within range, at operation 830 the substrate may be delivered onto the support structure or cooling plate (e.g., by lowering lift pins, robot transfer, etc.). In embodiments, the substrate may be held 50 mm or another distance above the surface of a support structure, and at operation 830, the heated substrate may be lowered for cooling.

At operation 840, a temperature of the support structure, and coolant within, can be measured. In embodiments, measurements may have already have been taken at previous operations, and those values can be used. In some embodiments, the support structure and/or coolant temperature may be sensed with any of the sensors and configurations discussed with respect to FIG. 7. In some embodiments, a controller calculates an incoming substrate temperature verses a coolant flow rate. This may include determining a coolant flow rate to apply based on the temperature of the incoming substrate.

At operation 850, a controller of the system (such as controller 784 of FIG. 7) may calculate a flow rate for the coolant, and cooling process duration, based on the sensed temperatures of the support structure or coolant, and/or the substrate. In some embodiments, a controller such as controller 784, or 150, as described in FIGS. 1A-B and 7 may be used. In some cases, any of the before-discussed control models, including machine learning models, may be used. The flow rate of the coolant may be controlled, and the cooling process may be enabled, according to the parameters determined at operation 840 and/or 822A-C. This may include modifying the flow rate of coolant through a flow structure (as flow structures have been previously described) through a support structure.

In embodiments, the maximum flow rate effected to the coolant may be 2 GPM.

At operation 860, properties of the coolant, such as temperature, flow rate, etc., and/or of the support structure (e.g., cooling plate) can be measured. In some embodiments, the support structure and/or coolant temperature may be sensed with any of the sensors and configurations discussed with respect to FIG. 7.

In embodiments, the controller of the system (as was previously described) may determine whether the properties of the coolant are within an acceptable range, or not. For example, in embodiments, the outlet coolant pressure and temperature may be compared to temperature thresholds or setpoints. In embodiments, an outlet coolant temperature within the temperature range 30 to 45 degrees Celsius may be seen as acceptable.

In embodiments, should the outlet coolant temperature be acceptable (e.g., less than a temperature setpoint), the process may move to operation 862, where a substrate is determined to be sufficiently cooled.

In embodiments, should the outlet coolant temperature be unacceptable (e.g., greater than a temperature setpoint), the process may move to operation 864, where further cooling time may be allotted before returning to operation 860. In alternative embodiments, operation 864 may return to operation 840 instead of to operation 860.

From operation 862, once a substrate has been determined to be sufficiently cooled, the process may move to operation 870. At operation 870, the substrate may be lifted off a surface of the cooling plate (e.g., support structure).

At operation 880, the substrate temperature may be detected (again, via any sensor discussed with respect to FIG. 7). Should the substrate be at or below room temperature, the substrate may be removed, and the process may end at operation 890. Should the substrate be above room temperature, the process may include lowering the substrate back onto the cooling plate, and returning to operation 840, to repeat portions of the process. The substrate may be further cooled.

Figure 9A:
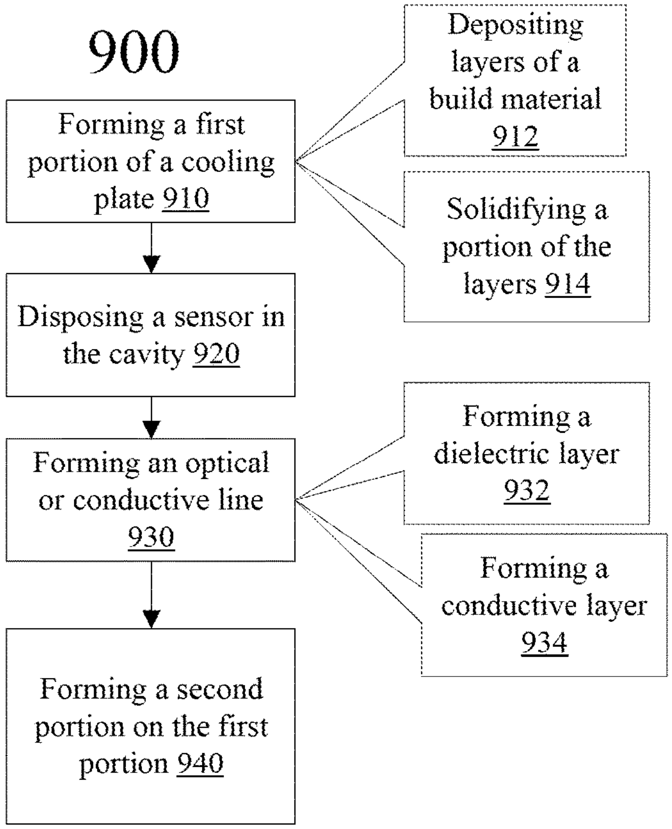
FIG. 9A is a flow diagram of an example method of forming a monolithic substrate support device of a load lock in accordance with one embodiment of the present disclosure.

FIG. 9A is a flow diagram of an example method of forming a monolithic substrate support device of a load lock in accordance with one embodiment of the present disclosure.

FIG. 9A illustrates a method 900 that may be performed by a manufacturing device that may include hardware, software, or a combination of both. The manufacturing device may make use of a build material, one or more energy sources, and a digital file to be used as a template for forming the monolithic substrate support device.

At block 910, method 900 may include forming a first portion of a cooling plate. In some embodiments, block 910 may further include forming, through an additive manufacturing process, a first portion of a cooling plate of the cooling station, the first portion comprising a cavity, one or more cooling channels and one or more additional channels, wherein the one or more cooling channels traverse an interior volume of the cooling plate according to a channel path having a defined pattern.

At block 912, the method may include depositing layers of a build material. In some embodiments, block 912 may further include depositing one or more layers of a build material according to a digital file.

At block 914, the method 900 may include solidifying a portion of the layers. In some embodiments, block 914 may further include solidifying at least a portion of the one or more layers of the build material via a directed energy source according to the digital file and repeating the depositing and the solidifying for one or more additional layers according to the digital file.

At block 920, the method 900 may include disposing a sensor in the cavity.

At block 930, the method 900 may include forming an optical or conductive line. In some embodiments, block 930 may further include forming at least one of an optical line or a conductive line in the one or more additional channels, wherein at least one of the optical line or the conductive line connects to the sensor.

At block 932, the method 900 may include forming a dielectric layer. In some embodiments, block 932 may further include forming a dielectric layer within the one or more additional channels.

At block 934, method 900 may include forming a conductive layer. In some embodiments, block 934 may further include forming a conductive layer within the dielectric layer, wherein the dielectric layer electrically insulates the one conductive lines from a body of the cooling plate.

At block 940, the method 900 may include forming a second portion on the first portion. In some embodiments, block 940 may further include forming, through the additive manufacturing process, a second portion of the cooling plate on the first portion of the cooling plate, wherein the second portion of the support structure at least partially covers the sensor.

Figure 9B:
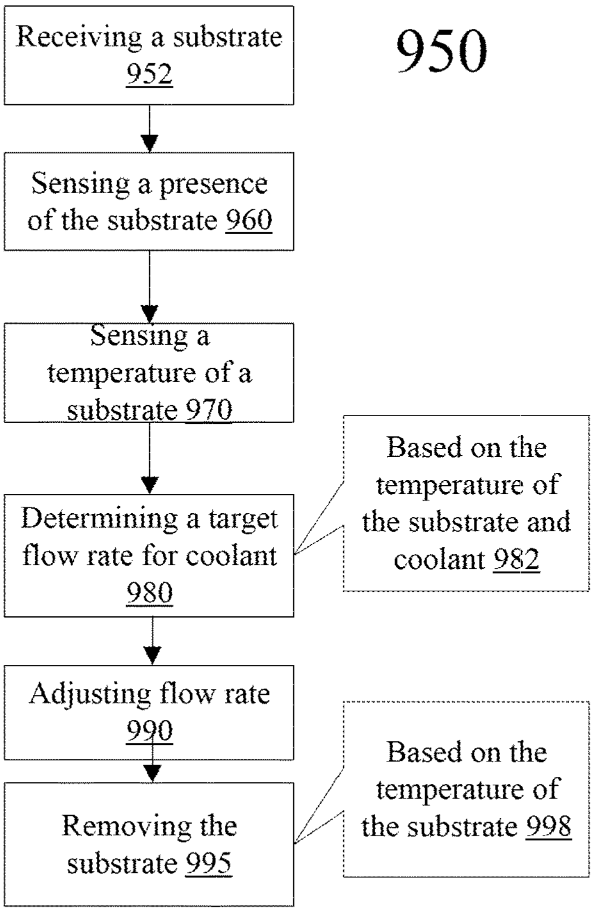
FIG. 9B is a flow diagram of an example method of adjusting the flow of a coolant in response to a determined target flow rate, in accordance with some embodiments of the present disclosure.

FIG. 9B is a flow diagram of an example method of adjusting the flow of a coolant in response to a determined target flow rate, in accordance with some embodiments of the present disclosure.

FIG. 9B illustrates a method 950 that may be performed by a manufacturing device that may include hardware, software, or a combination of both. The manufacturing device may make use of a cooling station, one or more integrated sensors, and a flow regulator to adjust the flow of coolant.

At block 952, method 950 may include receiving a substrate. In some embodiments, block 952 may further include receiving a substrate on a cooling plate of a cooling station.

At block 960, the method 950 may further include sensing a presence of the substrate. depositing layers of a build material. In some embodiments, block 960 may further include sensing, via one or more integrated proximity sensors of the cooling plate, a presence of the substrate.

At block 970, the method 950 may include sensing a temperature of a substrate. In some embodiments, block 970 may further include sensing, via one or more integrated temperature sensors of the support structure, a temperature of the substrate.

At block 980, the method 950 may include determining a target flow rate for the coolant. In some embodiments, block 980 may include determining a target flow rate for circulating coolant through one or more channels of the cooling plate based on data received from the integrated temperature sensor indicating the temperature of the substrate, At block 982, the method 950 may include determining a target flow rate for the coolant based on the temperature of the substrate and the coolant. In some embodiments, block 982 may further include determining the target flow rate of the coolant based at least on the temperature of the substrate and a temperature of the coolant.

At block 990, method 950 may include adjusting a flow rate. In some embodiments, block 990 may further include adjusting a flow rate of the coolant, via an associated flow regulator, based on the target flow rate, wherein a rate of heat extraction from the supported substrate is a product of the flow rate of the coolant through the one or more channels of the cooling plate.

At block 995, method 950 may include removing the substrate. In some embodiments, block 995 may further include removing the substrate from a cooling plate of a cooling station.

At block 998, the method 950 may include removing the substrate based on the temperature of the substrate. In some embodiments, block 998 may further include removing the substrate based on a sensed temperature of the substrate in comparison to a target temperature. In some embodiments, block 998 may further include removing the substrate based on a sensed temperature of the substrate being at or below a target temperature.

determining a target flow rate for the coolant based on the temperature of the substrate and the coolant. In some embodiments, block 982 may further include determining the target flow rate of the coolant based at least on the temperature of the substrate and a temperature of the coolant.

Figure 10:
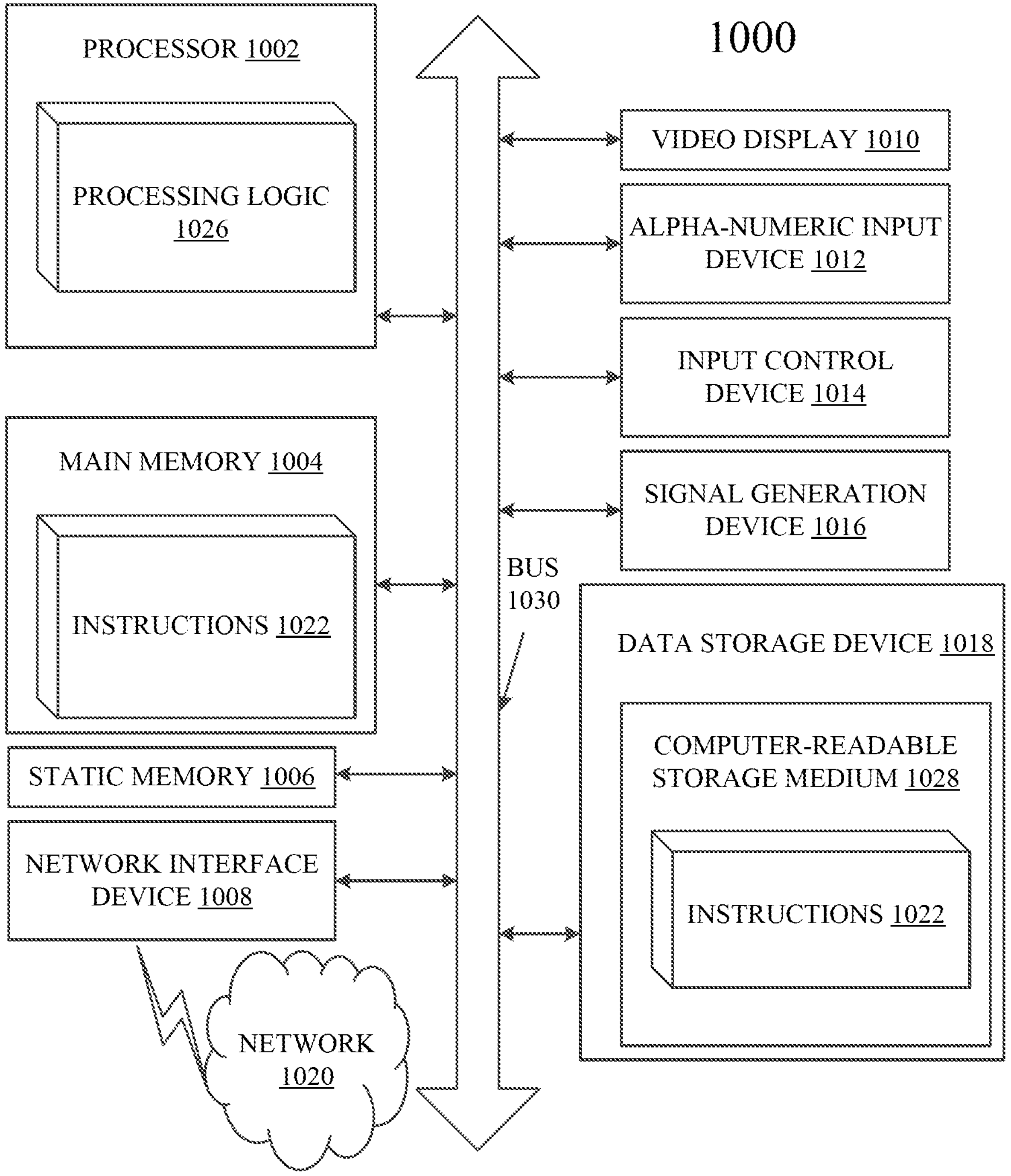
FIG. 10 illustrates an embodiment of a diagrammatic representation of a computing device associated with a substrate manufacturing system, according to some embodiments of the present disclosure.

FIG. 10 illustrates an embodiment of a diagrammatic representation of a computing device associated with a substrate manufacturing system, according to some embodiments of the present disclosure.

In one implementation, FIG. 10 illustrates a processing device 1000 that may be a part of any computing device associated with any of the above-described figures, or any combination thereof. Example processing device 1000 may be connected to other processing devices in a LAN, an intranet, an extranet, and/or the Internet. The processing device 1000 may be a personal computer (PC), a set-top box (STB), a server, a network router, switch or bridge, or any device capable of executing a set of instructions (sequential or otherwise) that specify actions to be taken by that device. Further, while only a single example processing device is illustrated, the term "processing device" shall also be taken to include any collection of processing devices (e.g., computers) that individually or jointly execute a set (or multiple sets) of instructions to perform any one or more of the methods discussed herein. Example processing device 1000 may include a processor 1002 (e.g., a CPU), a main memory 1004 (e.g., read-only memory (ROM), flash memory, dynamic random access memory (DRAM) such as synchronous DRAM (SDRAM), etc.), a static memory 1006 (e.g., flash memory, static random access memory (SRAM), etc.), and a secondary memory (e.g., a data storage device 1018), which may communicate with each other via a bus 1030.

Processor 1002 represents one or more general-purpose processing devices such as a microprocessor, central processing unit, or the like. More particularly, processor 1002 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 1002 may also be one or more special-purpose processing devices such as an application specific integrated circuit (ASIC), a field programmable gate array (FPGA), a digital signal processor (DSP), network processor, or the like. In accordance with one or more aspects of the present disclosure, processor 1002 may be configured to execute instructions (e.g. instructions 1022 may include a computing subsystem as seen at least in FIGS. 1 and 7.).

Example processing device 1000 may further comprise a network interface device 1008, which may be communicatively coupled to a network 1020. Example processing device 1000 may further comprise a video display 1010 (e.g., a liquid crystal display (LCD), a touch screen, or a cathode ray tube (CRT)), an alphanumeric input device 1012 (e.g., a keyboard), an input control device 1014 (e.g., a cursor control device, a touch-screen control device, a mouse), and a signal generation device 1016 (e.g., an acoustic speaker).

Data storage device 1018 may include a computer-readable storage medium (or, more specifically, a non-transitory computer-readable storage medium) 1028 on which is stored one or more sets of executable instructions 1022. In accordance with one or more aspects of the present disclosure, executable instructions 1022 may comprise executable instructions.

Executable instructions 1022 may also reside, completely or at least partially, within main memory 1004 and/or within processor 1002 during execution thereof by example processing device 1000, main memory 1004 and processor 1002 also constituting computer-readable storage media. Executable instructions 1022 may further be transmitted or received over a network via network interface device 1008.

While the computer-readable storage medium 1028 is shown in FIG. 10 as a single medium, the term "computer-readable storage medium" should be taken to include a single medium or multiple media (e.g., a centralized or distributed database, and/or associated caches and servers) that store the one or more sets of operating instructions. The term "computer-readable storage medium" shall also be taken to include any medium that is capable of storing or encoding a set of instructions for execution by the machine that cause the machine to perform any one or more of the methods described herein. The term "computer-readable storage medium" shall accordingly be taken to include, but not be limited to, solid-state memories, and optical and magnetic media.

It should be understood that the above description is intended to be illustrative, and not restrictive. Many other embodiment examples will be apparent to those of skill in the art upon reading and understanding the above description. Although the present disclosure describes specific examples, it will be recognized that the systems and methods of the present disclosure are not limited to the examples described herein, but may be practiced with modifications within the scope of the appended claims. Accordingly, the specification and drawings are to be regarded in an illustrative sense rather than a restrictive sense. The scope of the present disclosure should, therefore, be determined with reference to the appended claims, along with the full scope of equivalents to which such claims are entitled.

The embodiments of methods, hardware, software, firmware or code set forth above may be implemented via instructions or code stored on a machine-accessible, machine readable, computer accessible, or computer readable medium which are executable by a processing element. "Memory" includes any mechanism that provides (i.e., stores and/or transmits) information in a form readable by a machine, such as a computer or electronic system. For example, "memory" includes random-access memory (RAM), such as static RAM (SRAM) or dynamic RAM (DRAM); ROM; magnetic or optical storage medium; flash memory devices; electrical storage devices; optical storage devices; acoustical storage devices, and any type of tangible machine-readable medium suitable for storing or transmitting electronic instructions or information in a form readable by a machine (e.g., a computer).

Reference throughout this specification to "one embodiment" or "an embodiment" means that a particular feature, structure, or characteristic described in connection with the embodiment is included in at least one embodiment of the disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific exemplary embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment, embodiment, and/or other exemplarily language does not necessarily refer to the same embodiment or the same example, but may refer to different and distinct embodiments, as well as potentially the same embodiment.

The words "example" or "exemplary" are used herein to mean serving as an example, instance, or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an embodiment" or "one embodiment" or "an embodiment" or "one embodiment" throughout is not intended to mean the same embodiment or embodiment unless described as such. Also, the terms "first, " "second," "third," "fourth," etc. as used herein are meant as labels to distinguish among different elements and may not necessarily have an ordinal meaning according to their numerical designation.

A digital computer program, which may also be referred to or described as a program, software, a software application, a module, a software module, a script, or code, can be written in any form of programming language, including compiled or interpreted languages, or declarative or procedural languages, and it can be deployed in any form, including as a stand-alone program or as a module, component, subroutine, or other unit suitable for use in a digital computing environment. The essential elements of a digital computer a central processing unit for performing or executing instructions and one or more memory devices for storing instructions and digital data. The central processing unit and the memory can be supplemented by, or incorporated in, special purpose logic circuitry or quantum simulators. Generally, a digital computer will also include, or be operatively coupled to receive digital data from or transfer digital data to, or both, one or more mass storage devices for storing digital data, e.g., magnetic, magneto-optical disks, optical disks, or systems suitable for storing information. However, a digital computer need not have such devices.

Digital computer-readable media suitable for storing digital computer program instructions and digital data include all forms of non-volatile digital memory, media and memory devices, including by way of example semiconductor memory devices, e.g., EPROM, EEPROM, and flash memory devices; magnetic disks, e.g., internal hard disks or removable disks; magneto-optical disks; CD-ROM and DVD-ROM disks.

Control of the various systems described in this specification, or portions of them, can be implemented in a digital computer program product that includes instructions that are stored on one or more non-transitory machine-readable storage media, and that are executable on one or more digital processing devices. The systems described in this specification, or portions of them, can each be implemented as an apparatus, method, or system that may include one or more digital processing devices and memory to store executable instructions to perform the operations described in this specification.

While this specification contains many specific embodiment details, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

What is claimed is:

1. An electronic device manufacturing system comprising:

at least one load lock chamber configured to receive a substrate; and at least one substrate support device located within the at least one load lock chamber and configured to support the substrate within the at least one load lock chamber, wherein the at least one substrate support device comprises:

one or more cooling plates comprising:

a monolithic body; and one or more channels that are integral to the monolithic body and that traverse an interior volume of the one or more cooling plates and are configured to circulate a coolant within the one or more cooling plates, wherein the coolant is to extract heat from the substrate;

one or more sensors, in or on a manifold coupled to the one or more cooling plates, to collect sensor data indicative of one or more physical properties of the coolant or coolant flow; and a controller to perform at least one operation based on the sensor data, the at least one operation comprising at least one of: maintain a flow rate of the coolant, adjust the flow rate of the coolant, maintain a temperature of the coolant, adjust the temperature of the coolant, or cause a transfer robot to remove the substrate from the at least one substrate support device.

2. The electronic device manufacturing system of claim 1, wherein a cross-sectional shape of the one or more channels is a shape other than a circular shape.

3. The electronic device manufacturing system of claim 1, wherein the one or more channels comprise a path having a curve radius of at least 2 mm.

4. The electronic device manufacturing system of claim 2, wherein the cross-sectional shape is one of: a rectangular shape, a pentagonal shape, a hexagonal shape, an octagonal shape, a polygonal shape, a diamond shape, or a gyroid shape.

5. The electronic device manufacturing system of claim 1, wherein the one or more cooling plates comprise one or more regions having a lattice structure.

6. The electronic device manufacturing system of claim 1, wherein the one or more cooling plates further comprise an integrated sensor that is a temperature sensor or a proximity sensor, and wherein the integrated sensor is configured to detect a condition associated with the substrate comprising at least one of a temperature of the substrate, or a presence of the substrate.

7. The electronic device manufacturing system of claim 6, wherein the one or more cooling plates further comprise integrated channels housing at least one of: fiber optic lines running to the integrated sensor, or electrical lines running to the integrated sensor.

8. A substrate support device of an electronic device manufacturing system, the substrate support device comprising:

one or more cooling plates configured to support a substrate to be placed on the substrate support device, each cooling plate of the one or more cooling plates comprising:

a monolithic body; and one or more channels that are integral to the monolithic body and that traverse an interior volume of the cooling plate and are configured to circulate a coolant within the cooling plate, wherein the coolant is to extract heat from the substrate;

a leak detector in or on a manifold of the one or more cooling plates, the leak detector to detect a leak of the coolant;

one or more temperature sensors in or on the manifold to detect a first temperature of the coolant provided to the one or more cooling plates and a second temperature of the coolant received from the one or more cooling plates; and a pressure sensor in or on the manifold to detect a pressure of the coolant.

9. The substrate support device of claim 8, wherein the one or more cooling plates comprise a first cooling plate and a second cooling plate, wherein the manifold comprises a first manifold portion and a second manifold portion, wherein the first cooling plate and the first manifold portion are parts of a first monolithic structure, and wherein the second cooling plate and the second manifold portion are parts of a second monolithic structure mounted to the first monolithic structure.

10. The substrate support device of claim 8, wherein the one or more cooling plates comprise a first cooling plate and a second cooling plate, and wherein the manifold comprises a monolithic structure mounted to the first cooling plate and the second cooling plate.

11. The substrate support device of claim 8, wherein the manifold comprises a monolithic structure having one or more additional channels that couple to the one or more channels of the one or more cooling plates.

12. The electronic device manufacturing system of claim 1, wherein at least one of a top of the one or more cooling plates or a bottom of the one or more cooling plates comprises a plurality of rib structures configured to increase convection-based heat transfer of heat from the substrate.

13. An electronic device manufacturing system, comprising:

a chamber configured to receive a substrate; and a substrate support device located within the chamber and configured to support the substrate within the chamber, the substrate support device comprising:

one or more cooling plates comprising:

one or more channels that traverse an interior volume of the one or more cooling plates and are configured to circulate a coolant within the one or more cooling plates to extract heat from the substrate; and one or more integrated sensors, configured to detect one or more conditions associated with the substrate;

a manifold coupled to the one or more cooling plates, wherein the manifold is configured to deliver coolant to the one or more channels of the one or more cooling plates and to receive heated coolant from the one or more cooling plates; and a set of sensors in or on the manifold, the set of sensors comprising:

one or more temperature sensors to detect at least one of: a first temperature of the coolant provided to the one or more cooling plates or a second temperature of the coolant received from the one or more cooling plates; and at least one of: a pressure sensor to detect a pressure of the coolant, or a leak detector to detect a leak of the coolant.

14. The electronic device manufacturing system of claim 13, further comprising:

a flow regulator, configured to control a flow rate of the coolant circulating within the one or more cooling plates; and a controller configured to receive data indicative of the one or more conditions from the one or more integrated sensors and to cause the flow regulator to adjust the flow rate in response to the data indicative of the one or more conditions.

15. The electronic device manufacturing system of claim 14, wherein the controller is further configured to cause the flow regulator to enable or disable flow of coolant in response to a detected presence of a substrate.

16. The electronic device manufacturing system of claim 13, wherein the one or more cooling plates comprise a monolithic part with the one or more channels formed therein.

17. The electronic device manufacturing system of claim 13, wherein an integrated sensor of the one or more integrated sensors is a temperature sensor or a proximity sensor, and wherein the one or more conditions associated with the substrate comprise at least one of a temperature of the substrate, or a presence of the substrate.

18. The electronic device manufacturing system of claim 13, wherein the one or more cooling plates comprise integrated channels housing at least one of fiber optic lines running to the one or more integrated sensors or electrical lines running to the one or more integrated sensors.

19. The electronic device manufacturing system of claim 13, wherein the one or more cooling plates comprise a first cooling plate and a second cooling plate, wherein the manifold comprises a first manifold portion and a second manifold portion, wherein the first cooling plate and the first manifold portion are parts of a first monolithic structure, and wherein the second cooling plate and the second manifold portion are parts of a second monolithic structure mounted to the first monolithic structure.

20. The electronic device manufacturing system of claim 1, wherein the one or more sensors comprise:

a leak detector to collect data indicative of a leak of the coolant;

one or more temperature sensors to collect data indicative of a temperature of the coolant provided to, or received from, the one or more cooling plates; and a pressure sensor to collect data indicative of a pressure of the coolant.

* * * * *